(12) United States Patent
Kodama et al.

(10) Patent No.: US 6,485,883 B2
(45) Date of Patent: Nov. 26, 2002

(54) POSITIVE PHOTORESIST COMPOSITION

(75) Inventors: Kunihiko Kodama, Shizuoka (JP); Shinichi Kanna, Shizuoka (JP); Toshiaki Aoai, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/769,375

(22) Filed: Jan. 26, 2001

(65) Prior Publication Data
US 2001/0041300 A1 Nov. 15, 2001

(30) Foreign Application Priority Data
Jan. 27, 2000 (JP) .................................. 2000-019031

(51) Int. Cl.$^7$ .............................................. G03F 7/039
(52) U.S. Cl. ................. 430/170; 430/270.1; 430/914; 430/921; 430/925
(58) Field of Search ..................... 430/270.1, 914, 430/921, 925, 170

(56) References Cited

U.S. PATENT DOCUMENTS 4,537,854 A * 8/1985 Crivello ................. 430/283.1
5,736,296 A * 4/1998 Sato et al. .................. 430/170
6,245,478 B1 * 6/2001 Uetani et al. ................ 430/191

FOREIGN PATENT DOCUMENTS

| JP | 6-242606 | 9/1994 | ........... G03F/7/039 |
| JP | 7-333844 | 12/1995 | ........... G03F/7/029 |
| JP | 11-125907 | 5/1999 | ........... G03F/7/039 |

* cited by examiner

*Primary Examiner*—John S. Chu
(74) *Attorney, Agent, or Firm*—Sughrue Mion, PLLC

(57) ABSTRACT

A positive photoresist composition which comprises (A) a resin having a group which decomposes by the action of an acid to increase solubility in an alkaline developing solution, and (B) a compound which generates an aliphatic or aromatic carboxylic acid substituted with at least one fluorine atom upon irradiation with an actinic ray or radiation.

The positive photoresist composition of the present invention is improved in resolution and process allowance such as exposure margin and depth of focus in a lithographic technology using a light source having a short wavelength capable of conducting the ultra fine fabrication and a chemical amplification-type positive photoresist. Further, it exhibits the excellent performance when an electron beam is used as a light source for exposure.

21 Claims, No Drawings

POSITIVE PHOTORESIST COMPOSITION

FIELD OF THE INVENTION

The present invention relates to a positive photosensitive composition for use in the production of a lithographic printing plate, a semiconductor such as IC, a circuit board for liquid crystal and thermal head and in other photofabrication processes.

BACKGROUND OF THE INVENTION

As the photosensitive composition for use in the production of a lithographic printing plate, a semiconductor such as IC, a circuit board for liquid crystal and thermal head and in other photofabrication processes, various compositions are known and photoresist photosensitive compositions are ordinarily employed. The photoresist compositions are widely divided into positive photoresist compositions and negative photoresist compositions.

One of the positive photoresist photosensitive compositions is a chemical amplification-type resist composition as described in U.S. Pat. No. 4,491,628 and European Patent No. 249,139. The chemical amplification-type positive resist composition is a pattern formation material which generates an acid in an exposed area upon irradiation with a radiation such as a far ultraviolet ray and due to a reaction using the acid as a catalyst, solubility in a developing solution differentiates in the area irradiated with the active radiation from the non-irradiated area to form a pattern on a substrate.

Examples of such a resist composition include combinations of a compound capable of generating an acid by photolysis with an acetal or O,N-acetal compound as described in JP-A-48-89003 (the term "JP-A" as used herein means an "unexamined published Japanese patent application"), with an ortho ester or amide acetal compound as described in JP-A-51-120714, with a polymer having an acetal or ketal group on the main chain as described in JP-A-53-133429, with an enol ether compound as described in JP-A-55-12995, with an N-acyliminocarbonic acid compound as described in JP-A-55-126236, with a polymer having an ortho ester group on the main chain as described in JP-A-56-17345, with a tertiary alkyl ester compound as described in JP-A-60-3625, with a silyl ester compound as described in JP-A-60-10247 or with a silyl ether compound as described in JP-A-60-37549 and JP-A-60-121446. These combinations exhibit high photosensitivity since they have in principle a quantum yield exceeding 1.

A system which is stable at a room temperature but decomposes by heating in the presence of an acid to become alkali-soluble is also known and examples thereof include combinations of a compound capable of generating an acid on exposure with an ester or carbonic acid ester compound having a tertiary or secondary carbon (e.g., tert-butyl or 2-cyclohexenyl) as described, for example, in JP-A-59-45439, JP-A-60-3625, JP-A-62-229242, JP-A-63-27829, JP-A-63-36240, JP-A-63-250642, *Polym. Eng. Sce.,* Vol. 23, page 1012 (1983), *ACS. Sym.,* Vol. 242, page 11 (1984), *Semiconductor World,* November, 1987, page 91, *Macromolecules,* Vol. 21, page 1475 (1988), and *SPIE,* Vol. 920, page 42 (1988). Since such a system has high photosensitivity and a little absorption in a far ultraviolet region, it is suitable for ultra fine fabrication using a light source having a shorter wavelength.

In general, the chemical amplification-type positive photoresist composition is roughly divided into two types. Specifically, there are a chemical amplification positive photoresist of three-component type comprising an alkali-soluble resin, a compound capable of generating an acid upon irradiation with a radiation (hereinafter also referred to as a "photo-acid generator" sometimes) and a compound which has an acid-decomposable group and prevents the alkali-soluble resin from dissolution and a chemical amplification positive photoresist of two-component type comprising a resin having a group capable of being decomposed by a reaction with an acid to become alkali-soluble and a photo-acid generator.

The two-component or tree-component chemical amplification positive photoresist composition is subjected to exposure to generate an acid from the photo-acid generator, heat treatment and development thereby obtaining a resist pattern.

These chemical amplification-type positive photoresist compositions are suitable for ultra fine fabrication using a light source having a shorter wavelength as described above. However, further improvements in resolution and process allowance such as exposure margin and depth of focus have been desired.

A basic sulfonium compound is described as a photo-acid generator in JP-A-6-242606. A basic iodonium compound is described as a photo-acid generator in JP-A-7-333844. Also, the use of a compound generating a carboxylic acid together with a compound generating an acid other than a carboxylic acid is described as a photo-acid generator in JP-A-11-125907.

However, such a technique is still insufficient for meeting the ultra fine fabrication today and further improvements in resolution and process allowance such as exposure margin and depth of focus have been desired.

SUMMARY OF THE INVENTION

Therefore, an object of the present invention is to provide a positive photoresist composition which is improved in resolution and process allowance such as exposure margin and depth of focus in a lithographic technology using a light source having a short wavelength capable of conducting the ultra fine fabrication and a chemical amplification-type positive photoresist.

Other objects of the present invention will become apparent from the following description.

It has been found that the objects of the present invention are accomplished by the following positive photoresist compositions:

(1) a positive photoresist composition which comprises (A) a resin having a group which decomposes by the action of an acid to increase solubility in an alkaline developing solution, and (B) a compound which generates an aliphatic or aromatic carboxylic acid substituted with at least one fluorine atom upon irradiation with an actinic ray or radiation, (2) the positive photoresist composition as described in item (1) above, wherein the composition further comprises (D) a compound having a molecular weight of not more than 3,000 which decomposes by the action of an acid to increase solubility in an alkaline developing solution, (3) a positive photoresist composition which comprises (B) a compound which generates an aliphatic or aromatic carboxylic acid substituted with at least one fluorine atom upon irradiation with an actinic ray or radiation, (D) a compound having a molecular weight of not more than 3,000 which decomposes by the action of an acid to increase solubility in an alkaline developing solution, and (E) an alkali-soluble resin, (4) the positive photoresist composition as described in any one of items (1) to (3) above, wherein the composition further comprises (C) a compound which generates a sulfonic acid upon irradiation with an actinic ray or radiation, (5) the positive photoresist composition as described in any one of items (1) to (4) above, wherein the composition further comprises (F) a nitrogen-containing basic compound and (G) a fluorine-base or silicon-base surface active agent, (6) the positive photoresist composition as described in any one of items (1) to (5) above, wherein (B) the compound which generates an aliphatic or aromatic carboxylic acid substituted with at least one fluorine atom upon irradiation with an actinic ray or radiation is a compound represented by the following formula (I), (II) or (III):

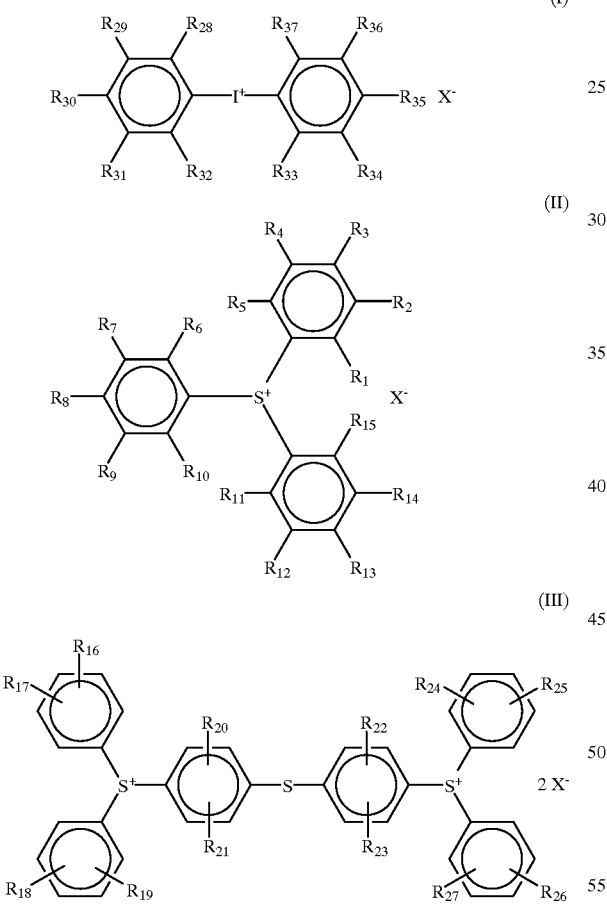

wherein $R_1$ to $R_{37}$, which may be the same or different, each represents a hydrogen atom, a straight chain, branched chain or cyclic alkyl group, a straight chain, branched chain or cyclic alkoxy group, a hydroxy group, a halogen atom or an $-S-R_{38}$ group (wherein $R_{38}$ represents a straight chain, branched chain or cyclic alkyl group or an aryl group); and $X^-$ represents an anion of an aliphatic or aromatic carboxylic acid substituted with at least one fluorine atom, (7) the positive photoresist composition as described in item (6) above, wherein $X^-$ represents an anion of a perfluoro aliphatic carboxylic acid or a perfluoro aromatic carboxylic acid, (8) the positive photoresist composition as described in item (6) above, wherein $X^-$ represents an anion of a perfluoro alkyl carboxylic acid having not less than 4 carbon atoms, (9) the positive photoresist composition as described in any one of items (1), (2) and (4) to (8) above, wherein (A) the resin having a group which decomposes by the action of an acid to increase solubility in an alkaline developing solution is a resin containing a repeating unit represented by formula (IV) shown below and a repeating unit represented by formula (V) shown below.

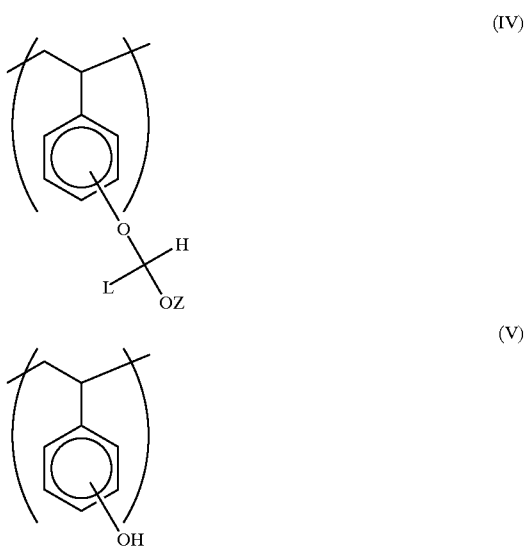

wherein L represents a hydrogen atom, a straight-chain, branched chain or cyclic alkyl group which may be substituted or an aralkyl group which may be substituted; Z represents a straight-chain, branched chain or cyclic alkyl group which may be substituted or an aralkyl group which may be substituted; or Z and L may be combined with each other to form a 5-membered or 6-membered ring,

(10) the positive photoresist composition as described in item (9) above, wherein Z in formula (IV) represents a substituted alkyl group or a substituted aralkyl group, and

(11) the positive photoresist composition as described in any one of items (1) to (10) above, wherein the composition further comprises (B') a compound which generates a carboxylic acid which is not substituted with a fluorine atom upon irradiation with an actinic ray or radiation.

DETAILED DESCRIPTION OF THE INVENTION

As described above, the use of a compound generating a carboxylic acid together with a compound generating an acid other than a carboxylic acid as a photo-acid generator is described in JP-A-11-125907. The compound generating a carboxylic acid does not directly contribute to decomposition of an acid-decomposable group, since the carboxylic acid generated is a weak acid. Accordingly, when the compound generating a carboxylic acid is used alone as a photo-acid generator, severe problems in that an image cannot be formed and in that sensitivity remarkably decreases occur. Therefore, the compound generating a carboxylic acid cannot be used alone as a photo-acid generator and it must be used together with a photo-acid generator which generates a strong acid.

The present inventors have found that the compound generating a carboxylic acid can be used alone by introducing a specific substituent thereto to solve these problems successfully and provide a photoresist composition having excellent performance.

The photoresist composition of the present invention also has excellent performance when an electron beam is used as a light source for exposure. In the case of exposing a photoresist to an electron beam, the incident electron has an electric charge and interacts with an atomic nucleus and electron of a substance constituting the resist. Therefore, scattering of the electron beam is sure to occur during the incidence of the electron beam to the resist film. As a result, a problem of degradation of pattern profile occurs. Even when a beam diameter is stopped down at the time of exposure in order to resolve a fine pattern, the exposed area is expanded due to the scattering and a problem of deterioration of resolution occurs. These problems on the exposure with an electron beam can also be solved splendidly according to the photoresist composition of the present invention.

The positive photoresist composition of the present invention includes (1) a positive photoresist composition comprising (A) a resin having a group which decomposes by the action of an acid to increase solubility in an alkaline developing solution and (B) a compound which generates an aliphatic or aromatic carboxylic acid substituted with at least one fluorine atom upon irradiation with an actinic ray or radiation as the indispensable components (hereinafter also referred to as a "first composition") and (2) a positive photoresist composition comprising (B) a compound which generates an aliphatic or aromatic carboxylic acid substituted with at least one fluorine atom upon irradiation with an actinic ray or radiation, (D) a compound having a molecular weight of not more than 3,000 which decomposes by the action of an acid to increase solubility in an alkaline developing solution and (E) an alkaline-soluble resin as the indispensable components (hereinafter also referred to as a "second composition").

The term "positive photoresist composition" or "composition" used hereinafter includes both the first composition and the second composition.

The components including the compounds and resins for use in the positive photoresist composition of the present invention will be described in greater detail below.

<Components Included in the Positive Photoresist Composition>

[1] (B) A compound which generates an aliphatic or aromatic carboxylic acid substituted with at least one fluorine atom upon irradiation with an actinic ray or radiation (Component (B)):

The positive photoresist composition contains the component (B) as the indispensable component.

Specific examples of the aliphatic carboxylic acid substituted with a fluorine atom of component (B) include a fluorine-substituted compound of an aliphatic carboxylic acid, for example, acetic acid, propionic acid, n-butyric acid, isobutyric acid, valerianic acid, trimethylacetic acid, caproic acid, heptanoic acid, caprylic acid, pelargonic acid, capric acid, lauric acid, myristic acid, palmitic acid, stearic acid, undecanoic acid, dodecanoic acid and tridecanoic acid. The aliphatic carboxylic acid may have a substituent, for example, a hydroxy group, an alkoxy group or a halogen atom (excluding a fluorine atom). Further, the aliphatic carboxylic acid which contains a linking group, for example, an oxygen atom, a sulfur atom, a carbonyl group, a carboxy group or a sulfonyl group in the aliphatic chain thereof is preferred.

Preferred examples of the aliphatic carboxylic acid substituted with a fluorine atom include those represented by the following formula (VI):

L—(CH$_2$)$_p$(CF$_2$)$_q$(CH$_2$)$_r$—COOH    (VI)

wherein L represents a hydrogen atom or a fluorine atom; p and r, which may be the same or different, each represents an integer of from 0 to 15; and q represents an integer of from 1 to 15.

The hydrogen atom or fluorine atom on the alkyl chain present in the compound represented by formula (VI) may be substituted with an alkyl group preferably having from 1 to 5 carbon atoms which may be substituted with a fluorine atom, an alkoxy group preferably having from 1 to 5 carbon atoms which may be substituted with a fluorine atom or a hydroxy group.

The aliphatic carboxylic acid substituted with a fluorine atom preferably includes a fluorine-substituted saturated aliphatic carboxylic acid having from 2 to 20 carbon atoms, preferably from 4 to 20 carbon atoms. By the use of the fluorine-substituted saturated aliphatic carboxylic acid having not less than 4 carbon atoms, diffusibility of the carboxylic acid generated decreases and change in line width due to the lapse of time from exposure to post baking is further prevented. Of the aliphatic carboxylic acids substituted with a fluorine atom, a fluorine-substituted compound of a saturated straight-chain or branched chain aliphatic carboxylic acid having from 4 to 18 carbon atoms is preferred.

The aromatic carboxylic acid substituted with a fluorine atom preferably includes a fluorine-substituted aromatic carboxylic acid having from 7 to 20 carbon atoms, preferably from 7 to 15 carbon atoms and more preferably from 7 to 11 carbon atoms.

Specific examples thereof include a fluorine-substituted compound of an aromatic carboxylic acid, for example, benzoic acid, a substituted benzoic acid, naphthoic acid, a substituted naphthoic acid, anthracenecarboxylic acid or a substituted anthracenecarboxylic acid (wherein the substituent including, for example, an alkyl group, an alkoxy group, a hydroxy group, a halogen atom (excluding a fluorine atom), an aryl group, an acyl group, an acyloxy group, a nitro group, an alkylthio group or an arylthio group). Of the aromatic carboxylic acids substituted with a fluorine atom, a fluorine-substituted compound of benzoic acid or a substituted benzoic acid is preferred.

The aliphatic or aromatic carboxylic acid substituted with a fluorine atom is a compound wherein at least one hydrogen atom attached to the skeleton other than the carboxylic group is substituted with a fluorine atom. Particularly, an aliphatic or aromatic carboxylic acid wherein all of hydrogen atoms attached to the skeleton other than the carboxylic group are substituted with fluorine atoms (preferably a perfluoro saturated aliphatic carboxylic acid or a perfluoro aromatic carboxylic acid) is preferred. The perfluoro aliphatic or aromatic carboxylic acid is excellent for further improvement in sensitivity.

Preferred components (B) include an onium salt compound (e.g., sulfonium salt or iodonium salt) having an anion of the aliphatic or aromatic carboxylic acid substituted with a fluorine atom described above as a counter anion, an imidocarboxylate compound having a carboxylic acid ester and a nitrobenzyl ester compound.

Compounds represented by formula (I), (II) or (III) described above are more preferred for the component (B). These compounds are excellent for further improvement in sensitivity, resolution and exposure margin. The compound generates an aliphatic (preferably an aliphatic) or aromatic carboxylic acid substituted with at least one fluorine atom corresponding to $X^-$ in formula (I), (II) or (III) upon irradiation with an actinic ray or radiation thereby acting as a photo-acid generator.

In formulae (I), (II) and (III), examples of the straight-chain or branched chain alkyl group represented by $R_1$ to $R_{38}$ include those having from 1 to 4 carbon atoms (e.g., a methyl group, an ethyl group, a propyl group, an n-butyl group, a sec-butyl group, and a tert-butyl group) which may have a substituent. Examples of the cyclic alkyl group represented by $R_1$ to $R_{38}$ include those having from 3 to 8 carbon atoms (e.g., a cyclopropyl group, a cyclopentyl group, and a cyclohexyl group) which may have a substituent. Examples of the straight-chain or branched chain alkoxyl group represented by $R_1$ to $R_{37}$ include those having from 1 to 4 carbon atoms (e.g., a methoxy group, an ethoxy group, a hydroxyethoxy group, a propoxy group, an n-butoxy group, an isobutoxy group, a sec-butoxy group, and a tert-butoxy group) which may have a substituent.

Examples of the cyclic alkoxyl group represented by $R_1$ to $R_{37}$ include those having from 5 to 6 carbon atoms (e.g., a cyclopentyloxy group, and a cyclohexyloxy group).

Examples of the halogen atom represented by $R_1$ to $R_{37}$ include a fluorine atom, a chlorine atom, a bromine atom, and an iodine atom.

Example of the aryl group represented by $R_{38}$ include those having from 6 to 14 carbon atoms (e.g., a phenyl group, a tolyl group, a methoxyphenyl group, and a naphthyl group) which may have a substituent.

Examples of the substituent for the above-described group include an alkoxyl group having from 1 to 4 carbon atoms, a halogen atom (e.g., a fluorine atom, a chlorine atom, and an iodine atom), an aryl group having from 6 to 10 carbon atoms, an alkenyl group having from 2 to 6 carbon atoms, a cyano group, a hydroxy group, a carboxy group, an ankoxycarbonyl group, and a nitro group.

The iodonium compound or sulfonium compound represented by formula (I), (II) or (III) for use in the present invention has an anion of the aliphatic or aromatic carboxylic acid substituted with at least one fluorine atom as the counter anion represented by $X^-$. Such an anion is an anion (—COO$^-$) formed by releasing a hydrogen atom from the carboxylic acid (—COOH).

Specific examples of the compound (photo-acid generator) of component (B) are set forth below, however, the present invention should not be construed as being limited thereto.

Specific examples (I-1) to (I-36) of the photo-acid generator represented by formula (I):

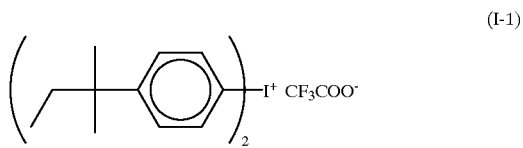

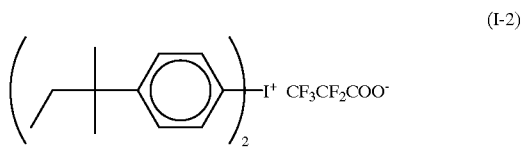

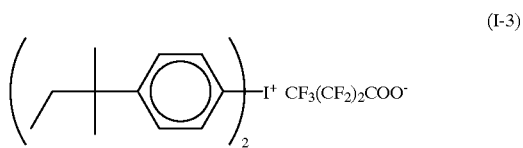

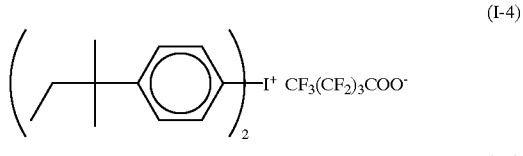

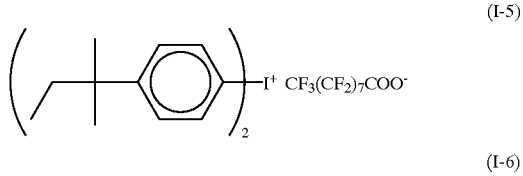

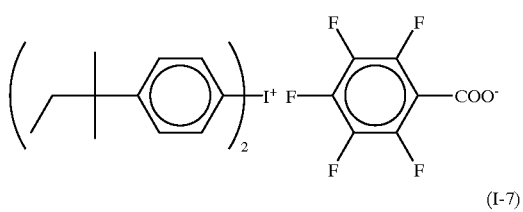

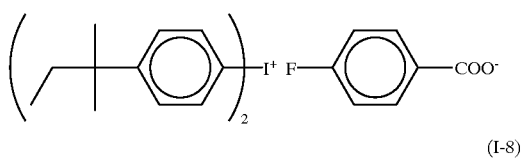

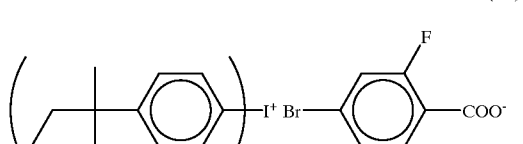

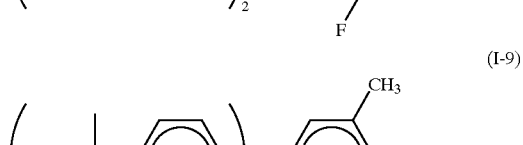

(I-10) 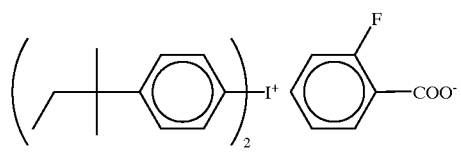
(I-11) 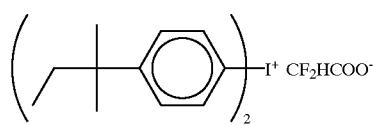
(I-12) 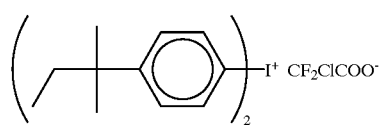
(I-13) 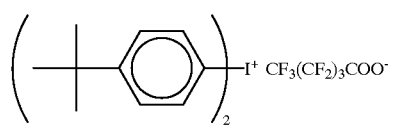
(I-14) 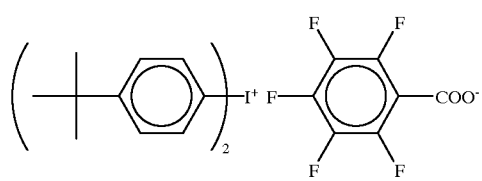
(I-15) 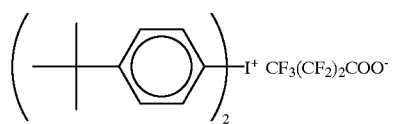
(I-16) 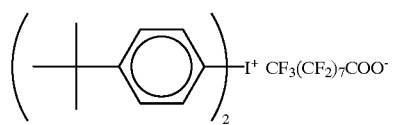
(I-17) 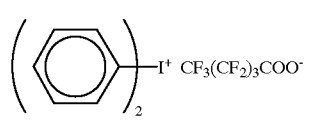
(I-18) 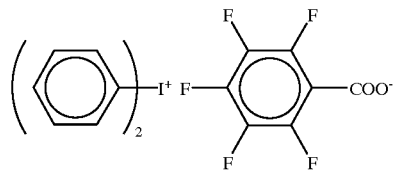
(I-19) 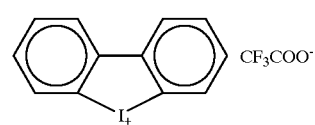
(I-20) 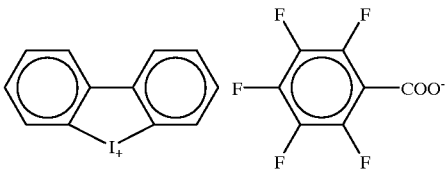
(I-21) 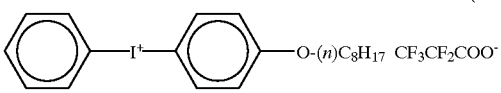
(I-22) 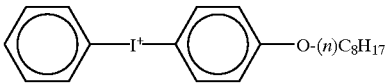
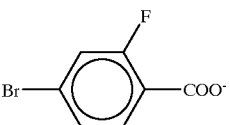
(I-23) 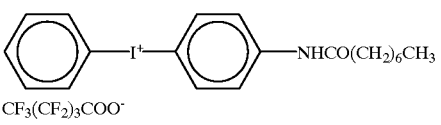
(I-24) 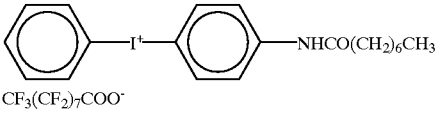
(I-25) 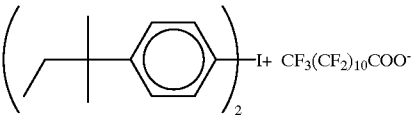
(I-26) 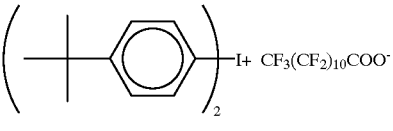
(I-27) 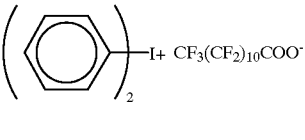
(I-28) 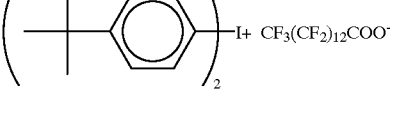
(I-29) 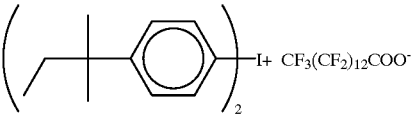

-continued
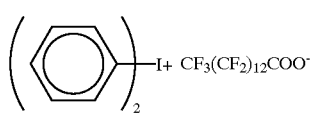 (I-30)
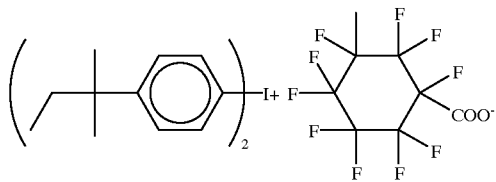 (I-31)
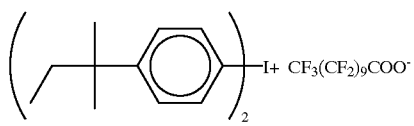 (I-32)
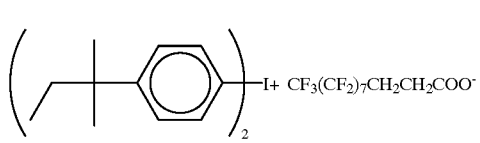 (I-33)
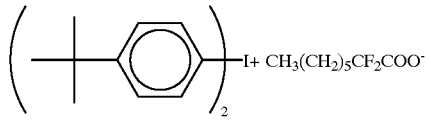 (I-34)
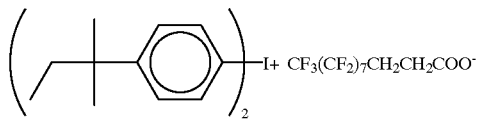 (I-35)
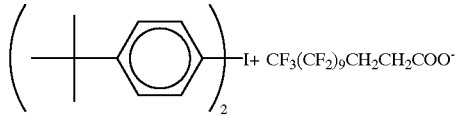 (I-36)
Specific examples (II-1) to (II-67) of the photo-acid generator represented by formula (II):
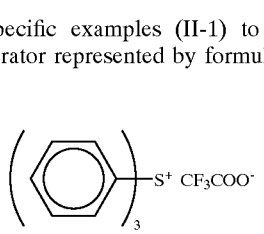 (II-1)
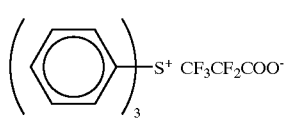 (II-2)
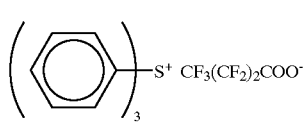 (II-3)
-continued
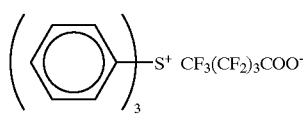 (II-4)
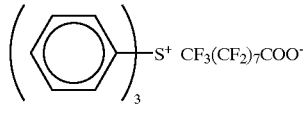 (II-5)
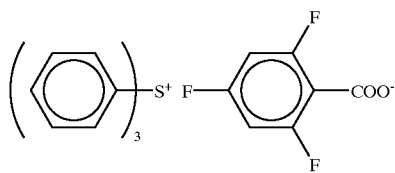 (II-6)
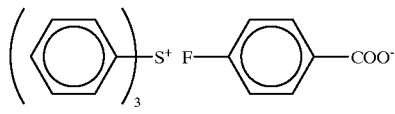 (II-7)
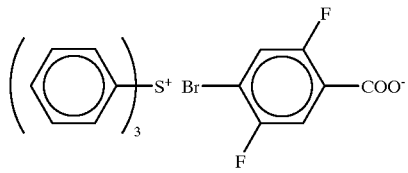 (II-8)
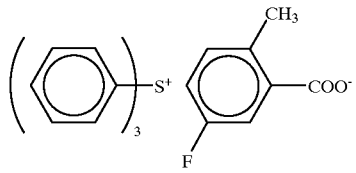 (II-9)
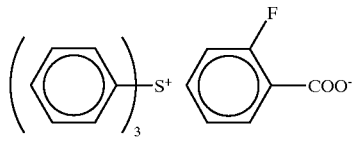 (II-10)
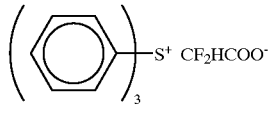 (II-11)
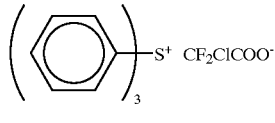 (II-12)
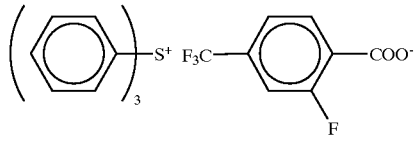 (II-13)

(II-14) 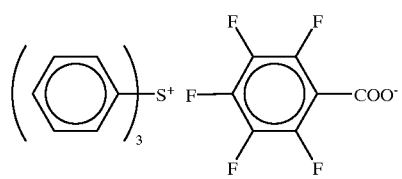
(II-15) 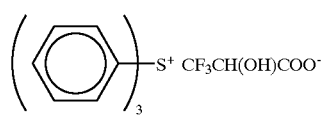
(II-16) 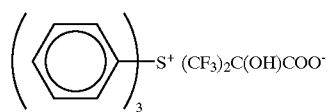
(II-17) 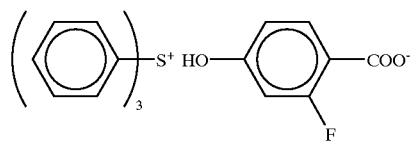
(II-18) 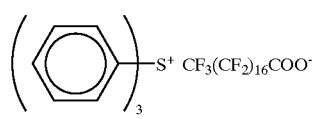
(II-19) 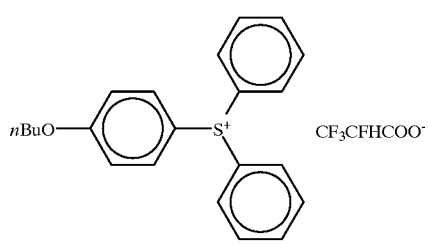
(II-20) 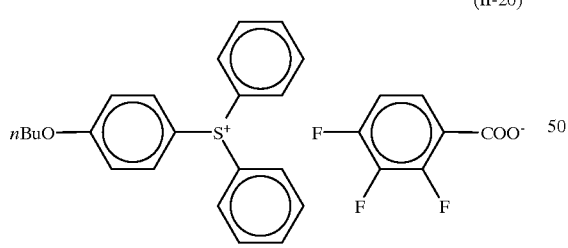
(II-21) 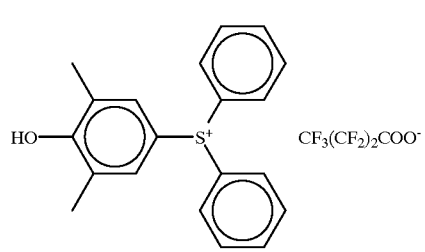
(II-22) 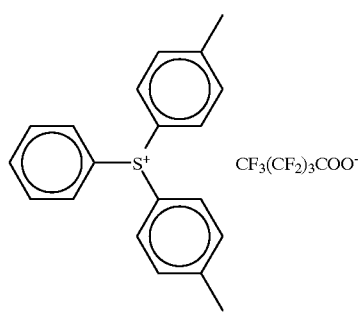
(II-23) 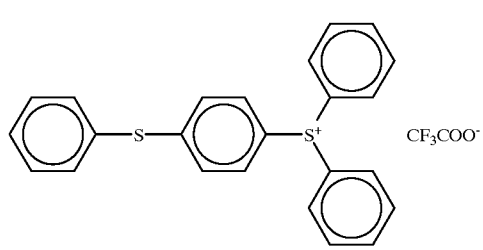
(II-24) 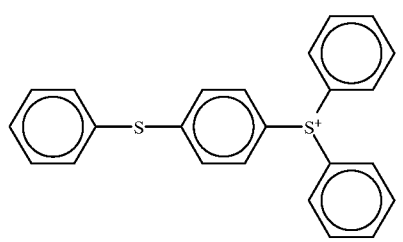
(II-25) 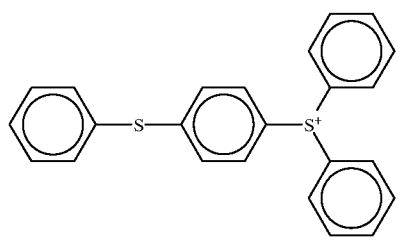
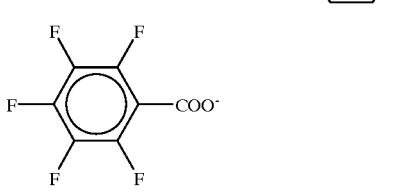
(II-26) 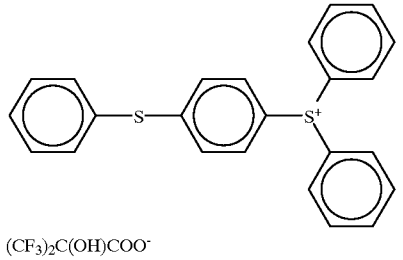

(II-27)
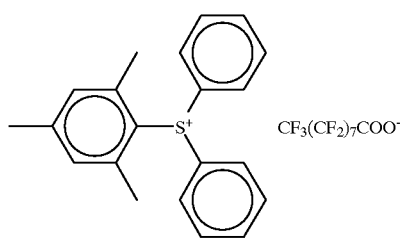
(II-28)
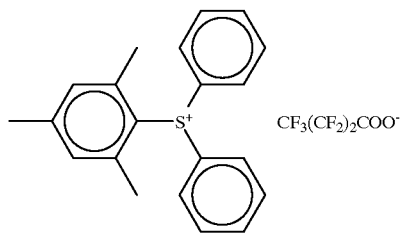
(II-29)
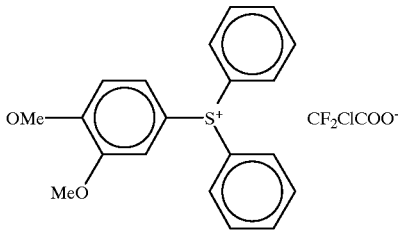
(II-30)
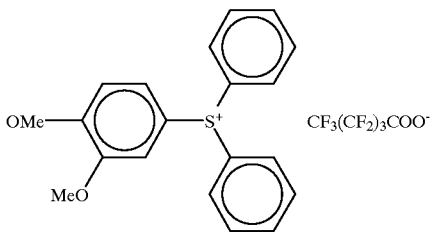
(II-31)
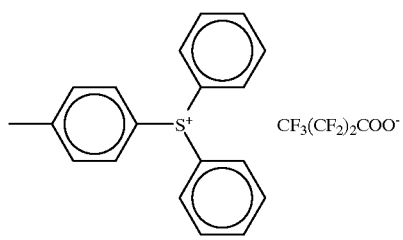
(II-32)
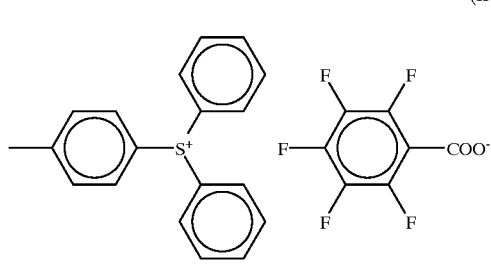
(II-33)
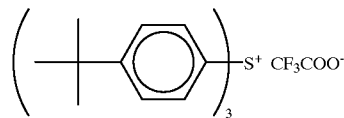
(II-34)
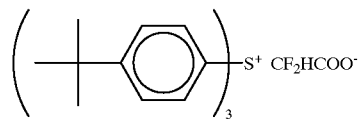
(II-35)
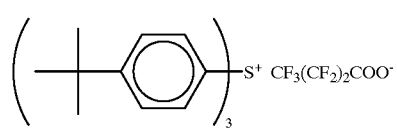
(II-36)
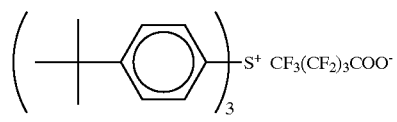
(II-37)
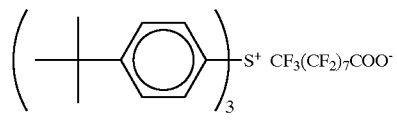
(II-38)
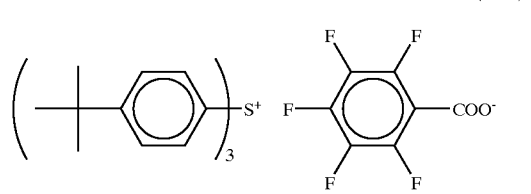
(II-39)
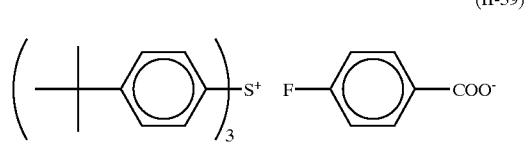
(II-40)
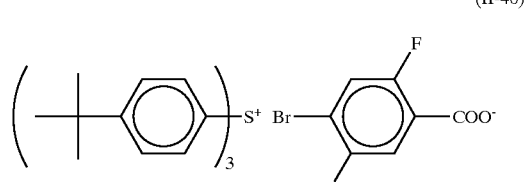
(II-41)
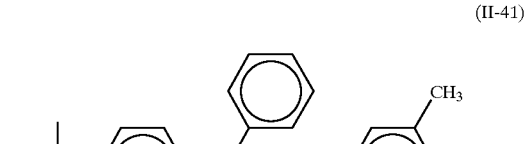
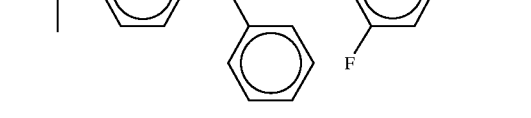

(II-42)
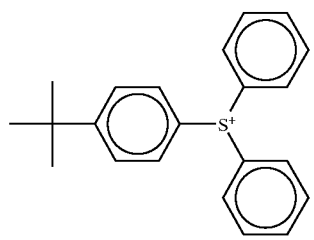 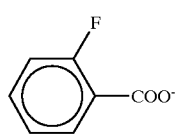
(II-43)
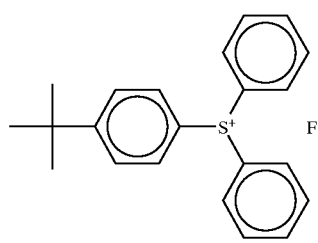 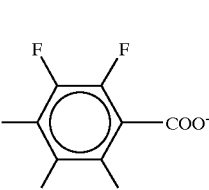
(II-43)
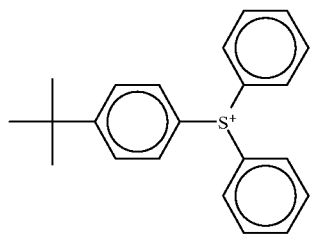 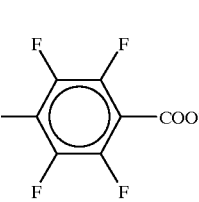
(II-44)
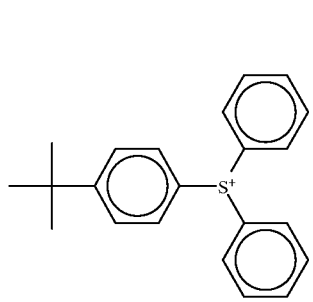 CF$_2$ClCOO$^-$
(II-45)
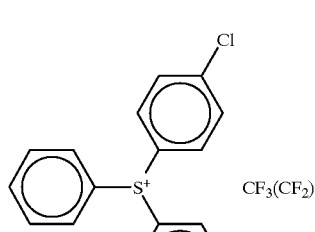 CF$_3$(CF$_2$)$_3$COO$^-$
(II-46)
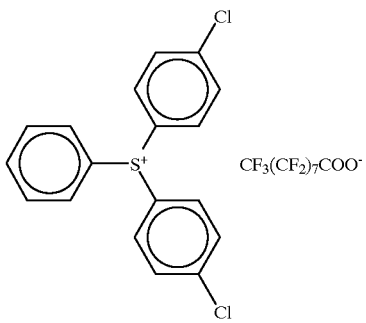 CF$_3$(CF$_2$)$_7$COO$^-$
(II-47)
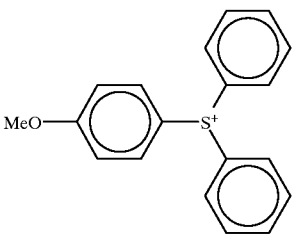
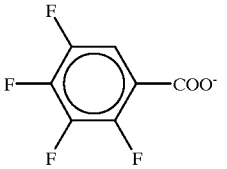
(II-48)
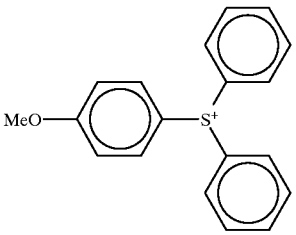 CF$_3$(CF$_2$)$_2$COO$^-$
(II-49)
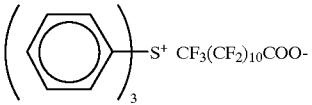
(II-50)
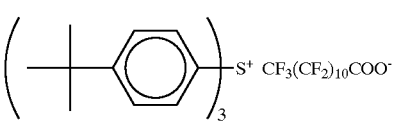
(II-51)
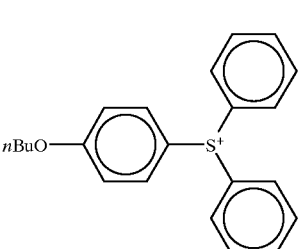 CF$_3$(CF$_2$)$_{10}$COO-

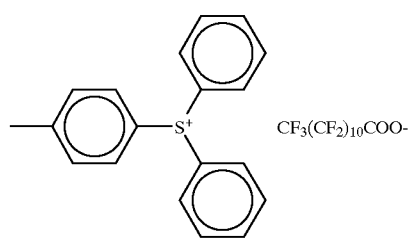 (II-52)
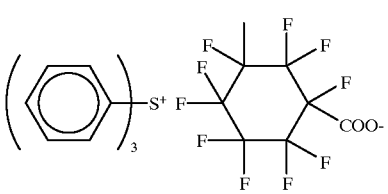 (II-59)
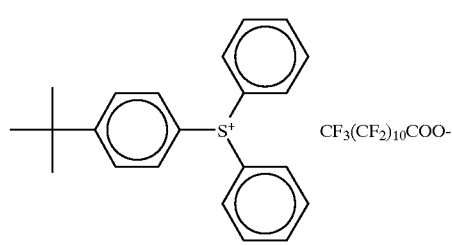 (II-53)
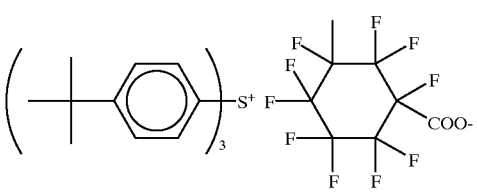 (II-60)
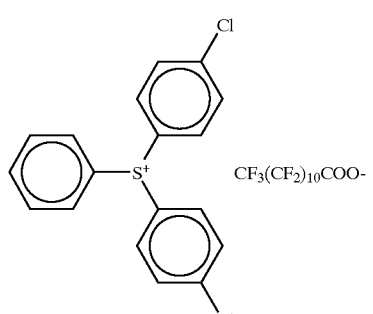 (II-54)
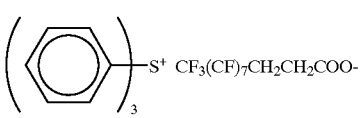 (II-61)
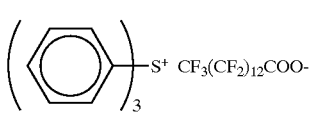 (II-55)
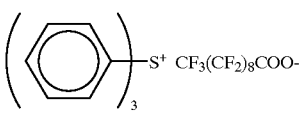 (II-62)
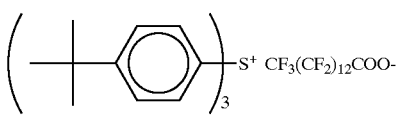 (II-56)
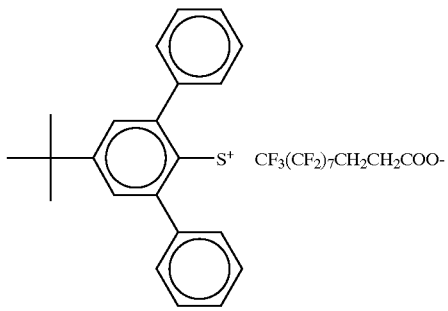 (II-63)
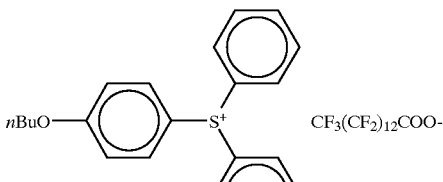 (II-57)
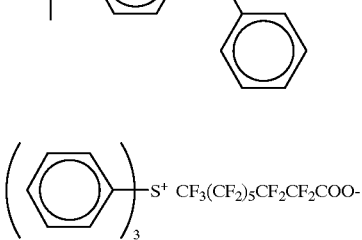 (II-64)
 (II-58)
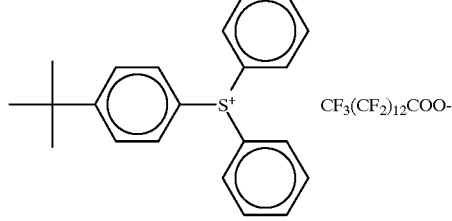 (II-65)

(II-66)
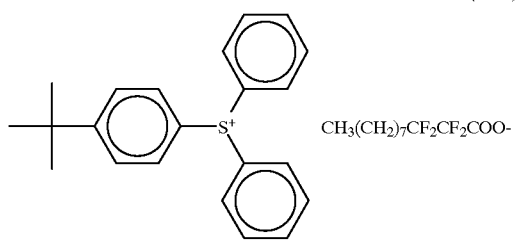
(II-67)
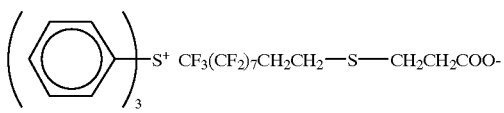
Specific examples (III-1) to (III-4) of the photo-acid generator represented by formula (III):
(III-1)
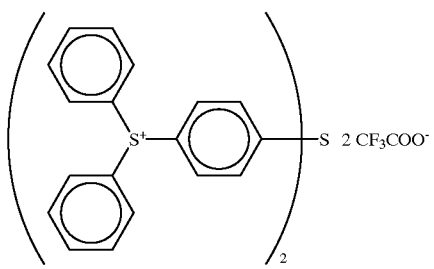
(III-2)
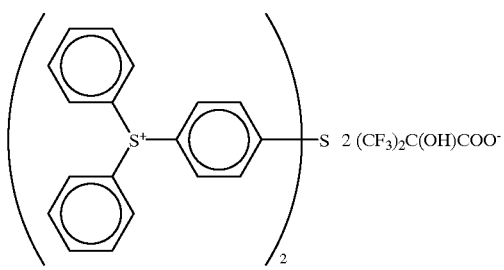
(III-3)
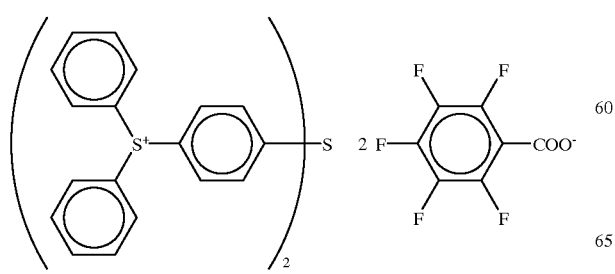
(III-4)
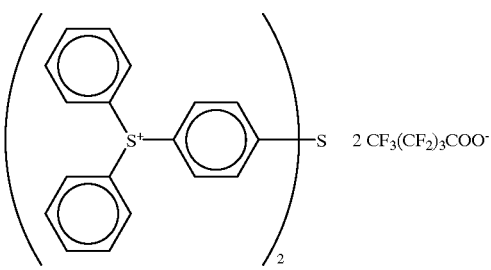
Specific examples (VI-1) to (V-4) of the photo-acid generator other than those represented by formulae (I) (II) and (III):
(IV-1)
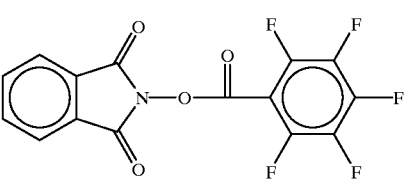
(IV-2)
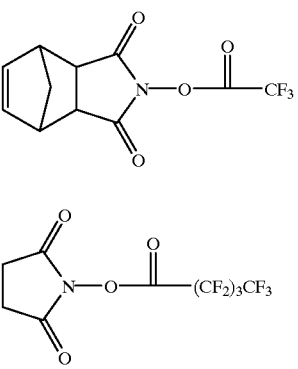
(IV-3)
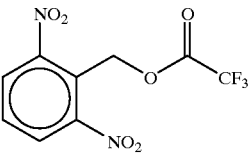
(V-1)
(V-2)
(V-3)
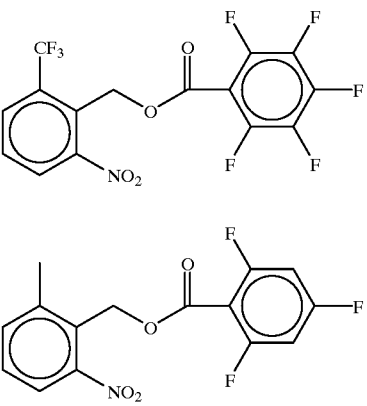

(V-4)

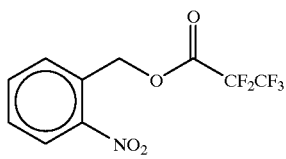

The compounds of component (B) may be used individually or in combination of two or more thereof.

The compound represented by formula (I) of component (B) can be synthesized by reacting an aromatic compound with a periodate and subjecting the resulting iodonium salt to salt exchange with a corresponding carboxylic acid.

The compound represented by formula (II) or (III) can be synthesized, for example, by a method comprising reacting an aryl Grignard reagent such as arylmagnesium bromide with a substituted or unsubstituted phenyl sulfoxide and subjecting the resulting triarylsulfonium halide to salt exchange with a corresponding carboxylic acid, a method comprising condensing a substituted or unsubstituted phenyl sulfoxide and a corresponding aromatic compound using an acid catalyst, e.g., methanesulfonic acid/diphosphorus pentaoxide or aluminum chloride and subjecting the resulting product to salt exchange, or a method comprising condensing diaryliodonium salt and diaryl sulfide using a catalyst, e.g., copper acetate and subjecting the resulting product to salt exchange.

The salt exchange can be conducted by a method wherein the halide salt formed is converted to a carboxylic acid salt using a silver reagent such as silver oxide or a method using an ion-exchange resin. The carboxylic acid or carboxylic acid salt for use in the salt exchange can be selected from commercially available compounds or can be obtained by a method of hydrolyzing a commercially available carboxylic acid halide.

As the fluorine-substituted carboxylic acid for the anion portion of the compound of component (B), that derived from fluoro-aliphatic compound prepared by a telomerization method (also referred to as a telomer method) or an oligomerization method (also referred to as an oligomer method) is also preferably used. Methods for the preparation of the fluoro-aliphatic compound are described, for example, in Nobuo Ishikawa ed., *Fussokagobutsu no Gosei to Kino* (Syntheses and Functions of Fluorine Compounds), pages 117 to 118, CMC Co., Ltd. (1987) and *Chemistry of Organic Fluorine Compounds II* (Monograph 187, Ed. by Milos Hudlicky and Attila E. Pavlath, American Chemical Society 1995), pages 747 to 752.

The telomerization method is a method in which a fluorine-containing vinyl compound such as tetrafluoroethylene is subjected to a radical polymerization using an alkyl halide having a large chain transfer constant such as an iodide as a telogen to prepare a telomer (shown in Scheme 1 below). In the preparation by the telomer method, a mixture of plural compounds each having a different carbon chain length is obtained. The mixture may be used as it is or after purification.

Scheme 1

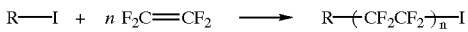

The terminal iodinated telomer is usually subjected to appropriate terminal chemical modification as shown in Scheme 2 below to prepare a fluoro-aliphatic compound. The resulting compound is further converted to a compound having the desired structure, if desired, and is employed for the preparation of the fluoro-aliphatic compound.

Scheme2

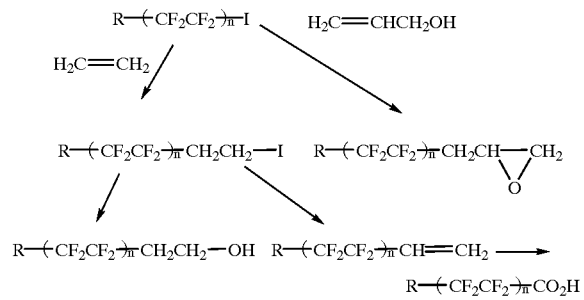

The content of the compound of component (B) is preferably from 0.1 to 20% by weight, more preferably from 0.5 to 10% by weight, still more preferably from 1 to 7% by weight, based on the solid content of the positive photoresist composition of the present invention.

[2] (C) A photo-acid generator which can be used together with the compound of component (B) (Component (C)):

In the positive photoresist composition of the present invention, a photo-acid generator other than the compound of component (B) can be used together with the compound of component (B).

The photo-acid generator which is used together with the compound of component (B) can be appropriately selected from photoinitiators for photo-cation polymerization, photoinitiators for photo-radical polymerization, photoachromatizing agents for dyes, photo-discoloring agents, and compounds which generate an acid by radiation conventionally used in a microresist or the like (an ultraviolet ray or far ultraviolet ray of from 200 to 400 nm, particularly preferably, a g-line, h-line, i-line or KrF excimer laser beam), an ArF excimer laser beam, an electron beam, an X ray, a molecular beam or an ion beam. A mixture of these compounds can also be used.

Other examples of the photo-acid generator used together with the compound of component (B) include onium salts such as diazonium salts, ammonium salts, phosphonium salts, iodonium salts, sulfonium salts, selenonium salts or arsonium salts, organic halide compounds, organic metal/ organic halide compounds, photo-acid generators having an o-nitrobenzyl-type protective group, compounds which photolyze to generate a sulfonic acid, represented by iminosulfonate and the like, disulfone compounds, diazoketosulfone compounds and diazodisulfone compounds.

Also, polymer compounds having the group or compound generating an acid by irradiation introduced into the main or side chain thereof may be used.

Further, compounds which generate an acid by irradiation as described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712 may be used.

Among the above-described compounds which decompose upon irradiation with an actinic ray or radiation to generate an acid, those which can be particularly effectively used include compounds represented by formula (PAG3), (PAG4), (PAG6) or (PAG7) described below.

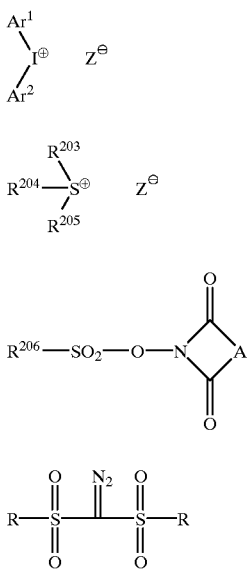

In formulae (PAG3) and (PAG4), $Ar^1$ and $Ar^2$, which may be the same or different, each represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

$R^{203}$, $R^{204}$ and $R^{205}$, which may be the same or different, each represents a substituted or unsubstituted alkyl group or a substituted or unsubstituted aryl group, preferably an aryl group having from 6 to 14 carbon atoms, an alkyl group having from 1 to 8 carbon atoms, or a substituted derivative thereof. Preferred examples of the substituent include, for the aryl group, an alkoxy group having from 1 to 8 carbon atoms, an alkyl group having from 1 to 8 carbon atoms, a nitro group, a carboxyl group, a hydroxyl group and a halogen atom, and for the alkyl group, an alkoxy group having from 1 to 8 carbon atoms, a carboxyl group and an alkoxycarbonyl group.

$Z^-$ represents a counter anion. Examples of the counter anion include $BF_4^-$, $AsF_6^-$, $PF_6^-$, $SbF_6^-$, $SiF_6^{2-}$, $ClO_4^-$, a substituted or unsubstituted alkanesulfonate anion, a perfluoroalkanesulfonate anion, a substituted or unsubstituted benzene sulfonate anion, a substituted or unsubstituted naphthalenesulfonate anion, a substituted or unsubstituted anthracene sulfonate anion and a substituted or unsubstituted camphorsulfonate anion, however, the present invention should not be construed as being limited thereto. Preferred examples of the counter anion include an alkanesulfonate anion, a perfluoroalkanesulfonate anion, an alkyl-substituted benzenesulfonate anion and pentafluorobenzenesulfonate anion.

Alternatively, two of $R^{203}$, $R^{204}$ and $R^{205}$ or $Ar^1$ and $Ar^2$ may be combined through a single bond or a substituent.

In formulae (PAG6) and (PAG7), $R^{206}$ represents a substituted or unsubstituted alkyl group or a substituted or unsubstituted aryl group, A represents a substituted or unsubstituted alkylene group, a substituted or unsubstituted alkenylene group or a substituted or unsubstituted arylene group, and R represents a straight-chain, branched chain or cyclic alkyl group or an aryl group which may be substituted.

Specific examples thereof include the following compounds, however, the present invention should not be construed as being limited thereto.

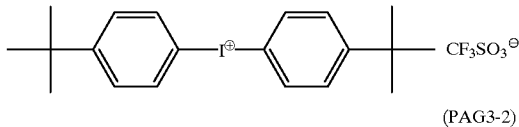
(PAG3-1)

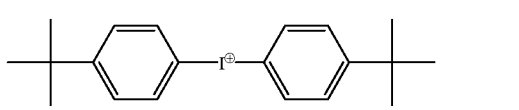
(PAG3-2)

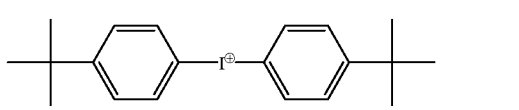

(PAG3-3)

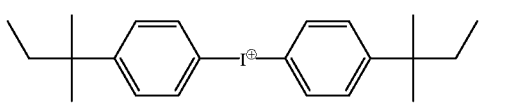

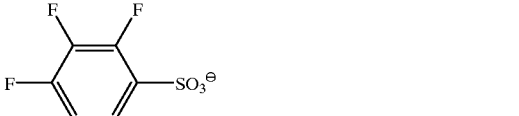
(PAG4-1)

(PAG4-2)

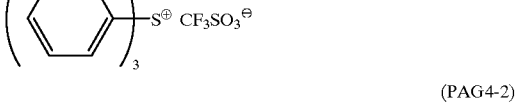

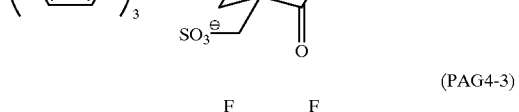
(PAG4-3)

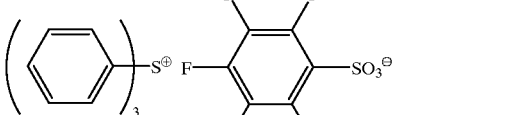

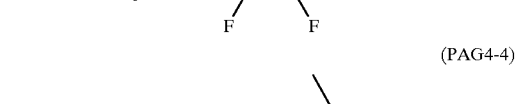
(PAG4-4)

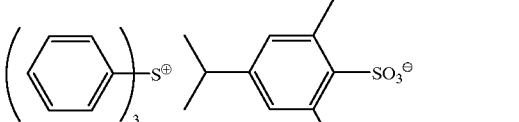

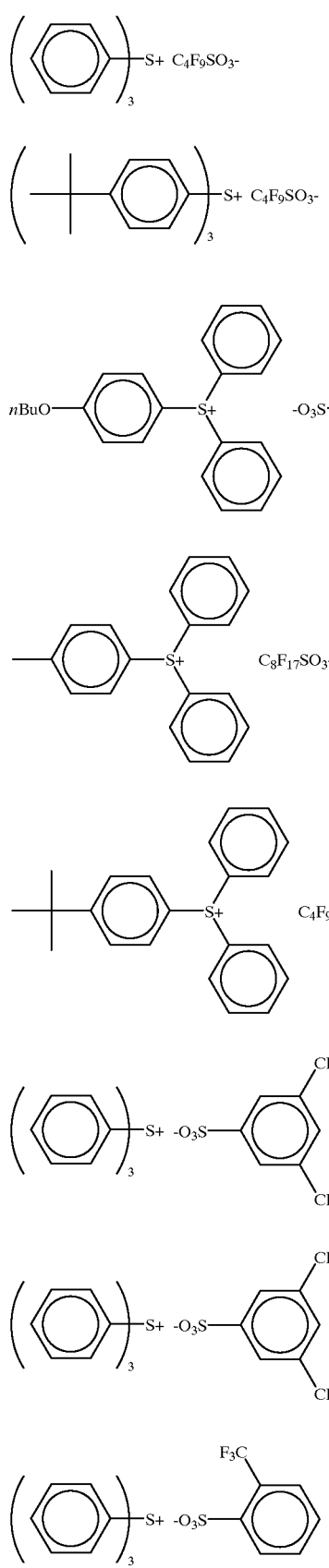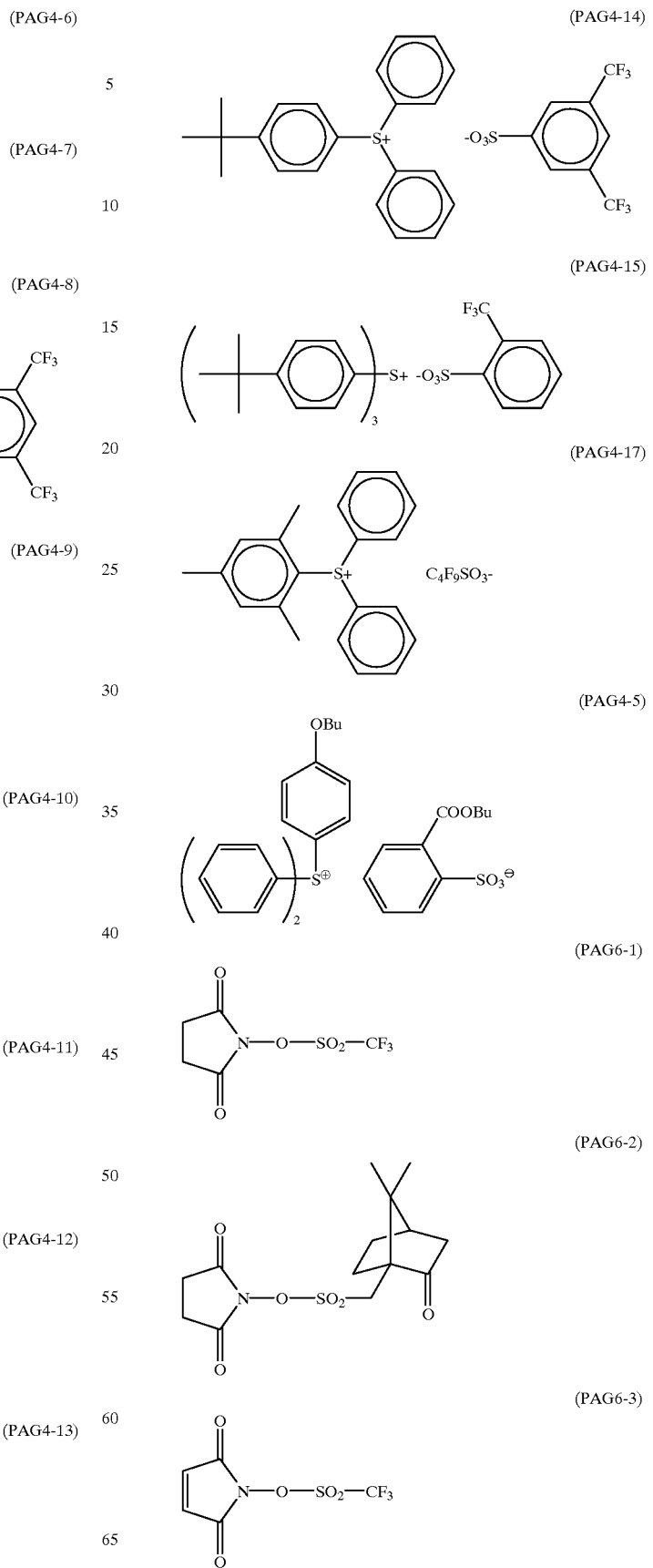

(PAG7-1)
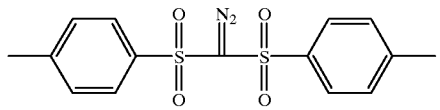

(PAG7-2)
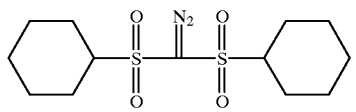

(PAG7-3)
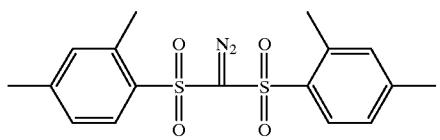

Among the photo-acid generators used together with the compound of component (B), (C) a compound which generates a sulfonic acid upon irradiation with an actinic ray or radiation is preferred in view of attaining improved sensitivity and resolution.

The positive photoresist composition of the present invention may contain a compound which generates a carboxylic acid upon irradiation with an actinic ray or radiation other than the compound of component (B) (hereinafter also referred to as Component (B')). By the use of such a compound, pitch dependency is improved.

Examples of the compound of component (B') include a compound represented by formula (I), (II) or (III) described above in which $X^-$ represents an anion of an aliphatic (preferably a saturated aliphatic) carboxylic acid or aromatic carboxylic acid, which is not substituted with a fluorine atom. Specific examples thereof include compounds of the specific examples of component (B) in which the fluorine atoms in the anion portions are substituted with hydrogen atoms.

The photo-acid generator used together with the compound of component (B) in the photoresist composition of the present invention is preferably selected from the compounds represented by formulae (PAG3), (PAG4) and (PAG7) and the compounds of component (B').

The compound of component (C) and/or component (B') may be used in a range of not more than 5% by weight, preferably not more than 4% by weight, based on the solid content of the positive photoresist composition of the present invention.

[3] (A) A resin having a group which decomposes by the action of an acid to increase solubility in an alkaline developing solution (Component (A)):

The component (A) is the indispensable component in the first composition of the present invention. The resin of component (A) having a group which decomposes with an acid and increases solubility in an alkaline developing solution (hereinafter also referred to as an "acid-decomposable group" sometimes) is a resin having introduced an acid-decomposable group into the polymer main chain or side chain, or both the polymer main chain and side chain. A resin having an acid-decomposable group in the side chain is more preferred.

Preferred examples of the group decomposable with an acid include a group represented by —COOA⁰ and a group represented by —O—B⁰. Examples of group containing such a group include a group represented by —R⁰—COOA⁰ and a group represented by —Ar—O—B⁰.

In the above formulae, A⁰ represents —C(R⁰¹)(R⁰²)(R⁰³), —Si(R⁰¹)(R⁰²)(R⁰³) or —C(R⁰⁴)(R⁰⁵)—O—R⁰⁶, and B⁰ represents —A⁰ or —CO—O—A⁰ (wherein R⁰, R⁰¹, R⁰², R⁰³, R⁰⁴, R⁰⁵, R⁰⁶ and Ar each has the same meaning as defined hereinafter).

Preferred examples of the acid-decomposable group include a silyl ether group, a cumyl ester group, an acetal group, a tetrahydropyranyl ether group, an enol ether group, an enol ester group, a tertiary alkyl ether group, a tertiary alkyl ester group and a tertiary alkylcarbonate group. More preferred examples thereof include a tertiary alkyl ester group, a tertiary alkylcarbonate group, a cumyl ester group, an acetal group and a tetrahydropyranyl ether group. An acetal group is particularly preferred.

A parent resin in the case wherein the acid-decomposable groups are bonded as a side chain is an alkali-soluble resin having an —OH group or a —COOH group, preferably an —R⁰—COOH group or an —Ar—OH group, in the side chain. For instance, the alkali-soluble resins described below can be exemplified as such parent resins.

An alkali-dissolution rate of the alkali-soluble resin is preferably not less than 170 angstrom/sec, more preferably not less than 330 angstrom/sec, when measured in 0.261 N tetramethylammonium hydroxide (TMAH) at 23° C.

In view of attaining a rectangular profile, an alkali-soluble resin which highly transmit a far ultraviolet ray or an excimer laser beam is preferred. Specifically, an alkali-soluble resin whose 1 μm-thick film has transmittance at 248 nm of from 20% to 90% is preferred.

Especially preferred examples of the alkali-soluble resin from such a standpoint include poly(o-, m-, or p-hydroxystyrene), copolymer of hydroxystyrene, hydrogenated poly(hydroxystyrene), halogen- or alkyl-substituted poly(hydroxystyrene), partially O-alkylated or O-acylated poly (hydroxystyrene), styrene/hydroxystyrene copolymer, α-methylstyrene/hydroxystyrene copolymer and hydrogenated novolak resin.

The resin having the acid-decomposable group for use in the present invention can be obtained by reacting an alkali-soluble resin with a precursor of the acid-decomposable group or by copolymerizing a monomer for forming an alkali-soluble resin and having the acid-decomposable group bonded thereto with any of various monomers, as described, for example, in European Patent 254,853, JP-A-2-25850, JP-A-3-223860 and JP-A-4-251259.

Specific examples of the resin having the acid-decomposable group for use in the present invention are set forth below, but the present invention should not be construed as being limited thereto.

p-tert-Butoxystyrene/p-hydroxystyrene copolymer
p-(tert-Butoxycarbonyloxy)styrene/p-hydroxystyrene copolymer
p-(tert-Butoxycarbonylmethyloxy)styrene/p-hydroxystyrene copolymer
4-(tert-Butoxycarbonylmethyloxy)-3-methylstyrene/4-hydroxy-3-methylstyrene copolymer
p-(tert-Butoxycarbonylmethyloxy)styrene/p-hydroxystyrene (10% hydrogenated) copolymer
m-(tert-Butoxycarbonylmethyloxy)styrene/m-hydroxystyrene copolymer o-(tert-Butoxycarbonylmethyloxy)styrene/o-hydroxystyrene copolymer p-(Cumyloxycarbonylmethyloxy)styrene/p-hydroxystyrene copolymer Cumyl methacrylate/methyl methacrylate copolymer 4-tert-Butoxycarbonylstyrene/dimethyl maleate copolymer Benzyl methacrylate/tetrahydropyranyl methacrylate copolymer p-(tert-Butoxycarbonylmethyloxy)styrene/p-hydroxystyrene/styrene copolymer p-tert-Butoxystyrene/p-hydroxystyrene/fumaronitrile copolymer p-tert-Butoxystyrene/hydroxyethyl methacrylate copolymer Styrene/N-(4-hydroxyphenyl)maleimide/N-(4-tert-butoxycarbonyloxyphenyl)maleimide copolymer p-Hydroxystyrene/tert-butyl methacrylate copolymer Styrene/p-hydroxystyrene/tert-butyl methacrylate copolymer p-Hydroxystyrene/tert-butyl acrylate copolymer Styrene/p-hydroxystyrene/tert-butyl acrylate copolymer p-(tert-Butoxycarbonylmethyloxy)styrene/p-hydroxystyrene/N-methylmaleimide copolymer tert-Butyl methacrylate/1-adamantylmethyl methacrylate copolymer p-Hydroxystyrene/tert-butyl acrylate/p-acetoxystyrene copolymer p-Hydroxystyrene/tert-butyl acrylate/p-(tert-butoxycarbonyloxy)styrene copolymer p-Hydroxystyrene/tert-butyl acrylate/p-(tert-butoxycarbonylmethyloxy)styrene copolymer Of the resins of component A having the acid-decomposable group, resins containing a repeating unit represented by formula (IV) and a repeating unit represented by formula (V) described above are preferred. The resulting photoresist composition has high resolution and change in its performance with the lapse of time from exposure to baking is further restrained.

The straight-chain, branched chain or cyclic alkyl group for L and Z in formula (IV) includes that having from 1 to 20 carbon atoms, for example, methyl ethyl, propyl, isopropyl, n-butyl, isobutyl, tert-butyl, pentyl, cyclopentyl, hexyl, cyclohexyl, octyl and dodecyl.

Preferred examples of the substituent for the alkyl group include an alkyl group, an alkoxy group, a hydroxy group, a halogen atom, a nitro group, an acyl group, an acylamino group, a sulfonylamino group, an alkylthio group, an arylthio group and aralkylthio group. Specific examples of the substituted alkyl group include cyclohexylethyl, alkylcarbonyloxymethyl, alkylcarbonyloxyethyl, arylcarbonyloxyethyl, aralkylcarbonyloxyethyl, alkyloxymethyl, aryloxymethyl, aralkyloxymethyl, alkyloxyethyl, aryloxyethyl, aralkyloxyethyl, alkylthiomethyl, arylthiomethyl, aralkylthiomethyl, alkylthioethyl, arylthioethyl and aralkylthioethyl. The alkyl group contained theses groups is not particularly limited and includes any of straight-chain, branched chain or cyclic alkyl group. Examples of such alkyl-substituted group include, for example, cyclohexylcarbonyloxyethyl, tert-butylcyclohexylcarbonyloxyethyl and n-butyl cyclohexylcarbonyloxyethyl. The aryl group contained theses groups is also not particularly limited and may be substituted. Examples of such aryl-substituted group include, for example, phenyloxyethyl and cyclohexylphenyloxyethyl. The aralkyl group contained theses groups is also not particularly limited. Examples of such aralkyl-substituted group include, for example, benzylcarbonyloxyethyl.

The aralkyl group for L and Z in formula (IV) includes that having from 7 to 15 carbon atoms, for example, a substituted or unsubstituted benzyl group and a substituted or unsubstituted phenethyl group. Preferred examples of the substituent for the aralkyl group include an alkoxy group, a hydroxy group, a halogen atom, a nitro group, an acyl group, an acylamino group, a sulfonylamino group, an alkylthio group, an arylthio group and aralkylthio group. Specific examples of the substituted aralkyl group include alkoxybenzyl, hydroxybenzyl and phenylthiophenetyl.

It is preferred that Z represents a substituted alkyl group or a substituted aralkyl group, since further improvement in edge roughness is recognized. Preferred examples of the substituent for the alkyl group include a cyclic alkyl group, an aryloxyl group, an alkylcarboxy group, an arylcarboxy group and an aralkylcarboxy group. Preferred examples of the substituent for the aralkyl group include an alkyl group, a cyclic alkyl group and a hydroxy group.

The 5-membered or 6-membered ring formed by being combined with Z and L each other includes, for example, a tetrahydropyran ring and a tetrahydrofuran ring.

A molar ratio of the repeating unit represented by formula (IV)/the repeating unit represented by formula (V) present in the resin is preferably from 1/99 to 60/40, more preferably from 5/95 to 50/50 and still more preferably from 10/90 to 40/60.

The resin containing the repeating unit represented by formula (IV) and the repeating unit represented by formula (V) described above may further contain a repeating unit derived from other monomer(s).

Examples of the other monomer include a hydrogenated hydroxystyrene; a halogen-, alkoxy- or alkyl-substituted hydroxystyrene; styrene; a halogen-, alkoxy- acyloxy- or alkyl-substituted styrene; maleic anhydride; an acrylic acid derivative; a methacrylic acid derivative; and an N-substituted maleimide, but the present invention should not be construed as being limited thereto.

A molar ratio of the repeating unit represented by formula (IV) and the repeating unit represented by formula (V)/the repeating unit of other monomer, i.e., [(IV)+(V)]/[other monomer]present in the resin is ordinarily from 100/0 to 50/50, preferably from 100/0 to 60/40 and more preferably from 100/0 to 70/30.

Specific examples of the resin containing the repeating unit represented by formula (IV) and the repeating unit represented by formula (V) and other resin which can be used in the present invention are set forth below, bur the present invention should not be construed as being limited thereto.

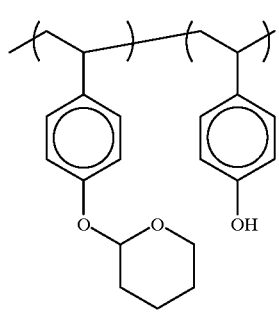
(A-1)
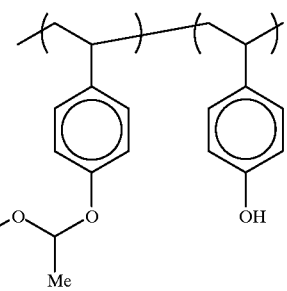
(A-2)
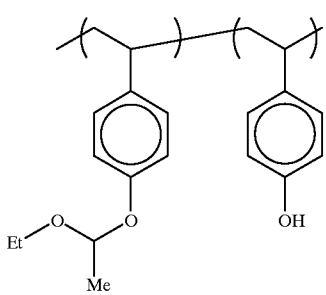
(A-3)
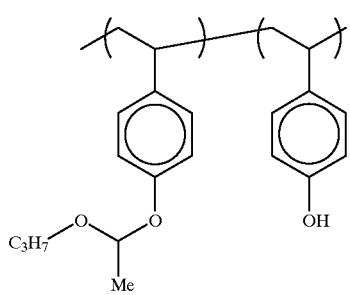
(A-4)
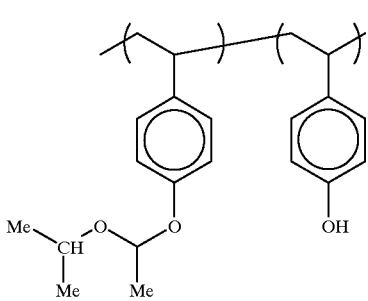
(A-5)
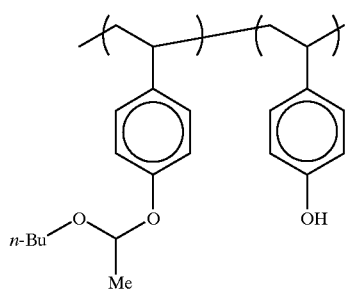
(A-6)
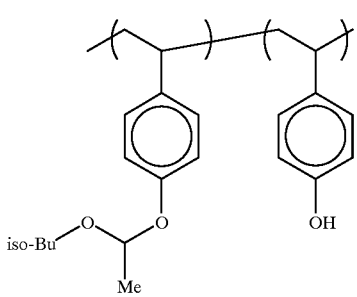
(A-7)
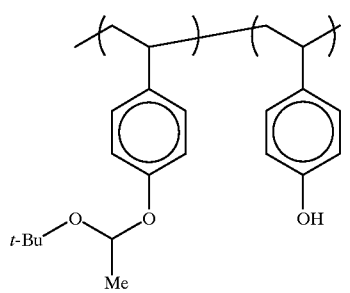
(A-8)
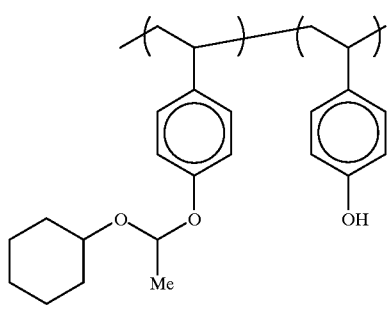
(A-9)
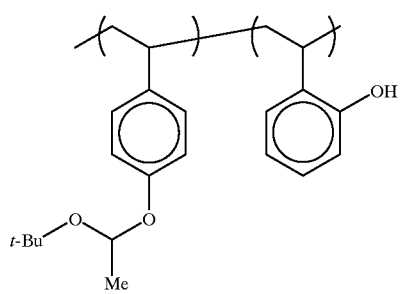
(A-10)

(A-11)
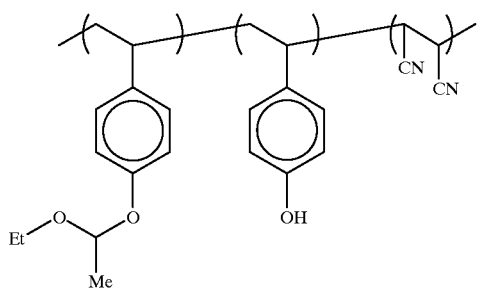
(A-12)
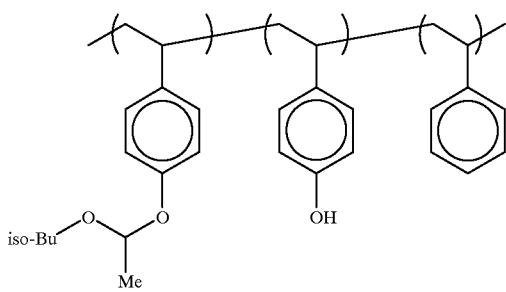
(A-13)
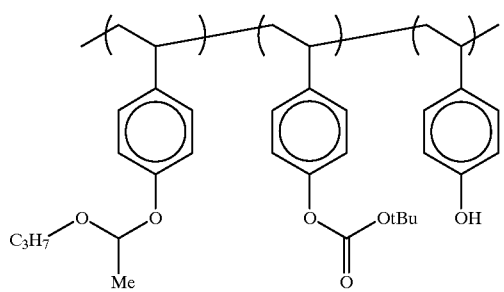
(A-14)
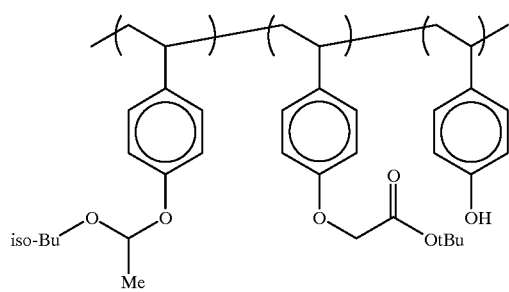
(A-15)
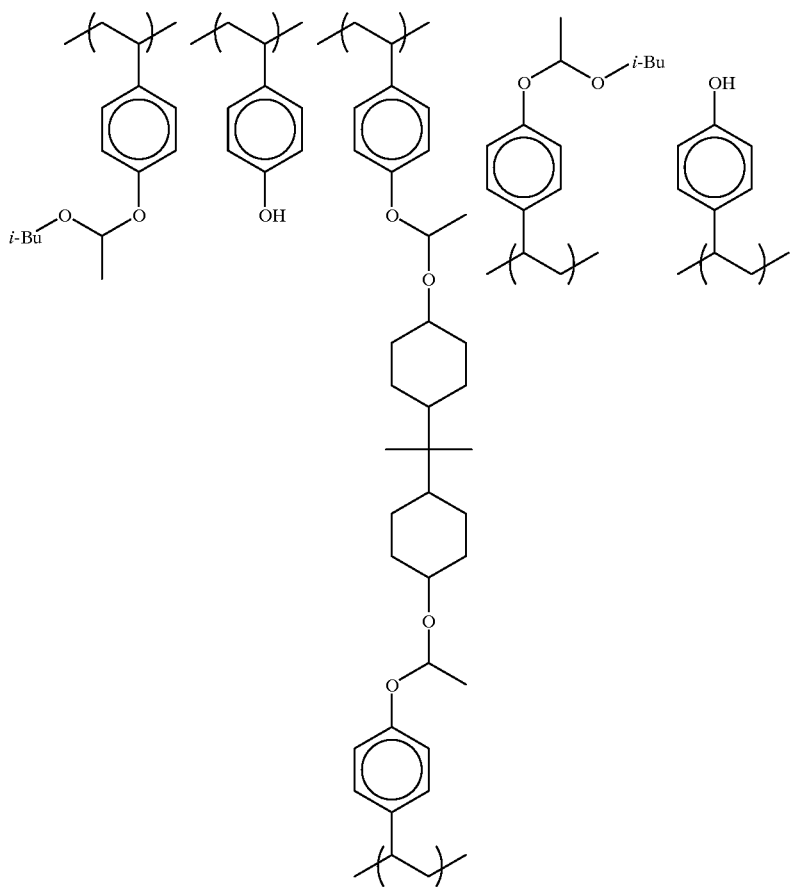

-continued
(A-16)
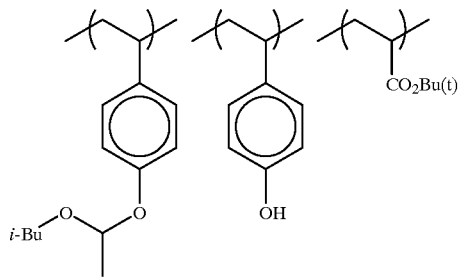
(A-17)
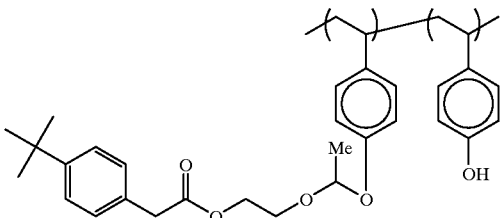
(A-18)
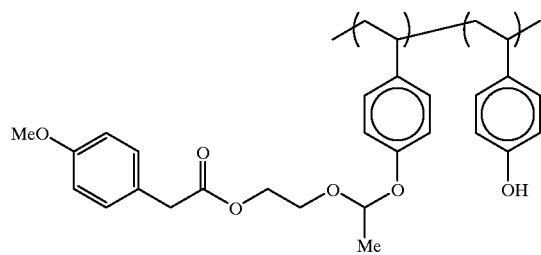
(A-19)
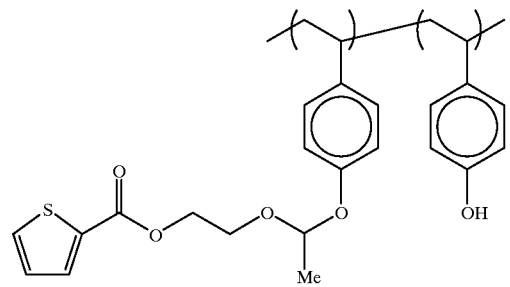
(A-20)
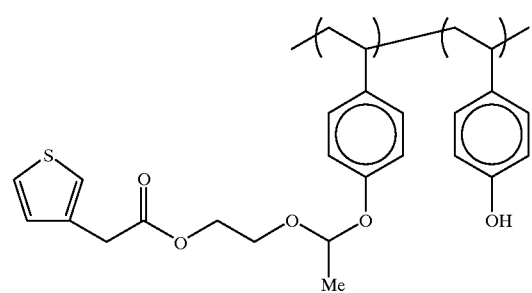
(A-21)
(A-22)
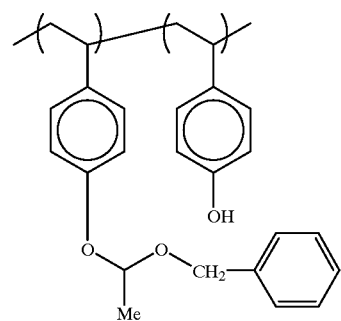
(A-23)
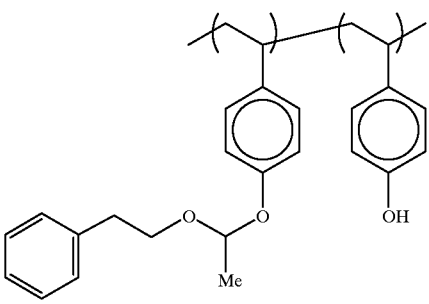
(A-24)
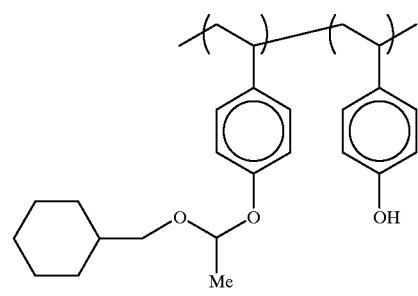
(A-25)
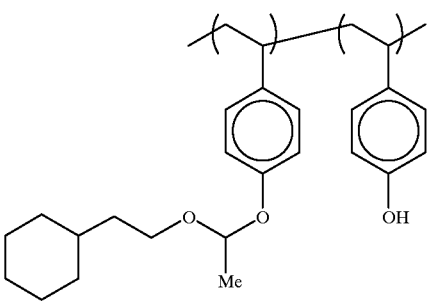

-continued
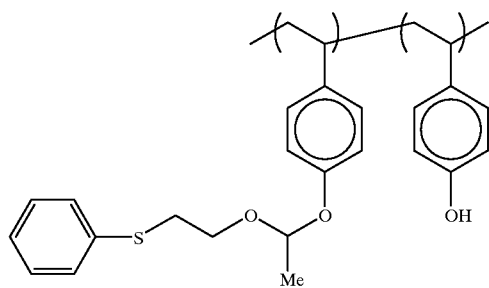
(A-26)
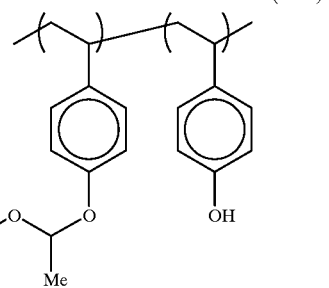
(A-27)
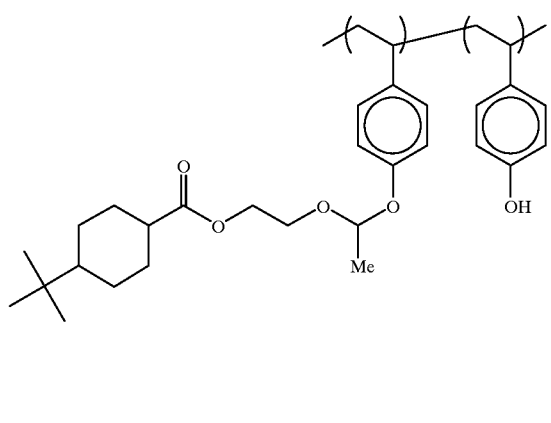
(A-28)
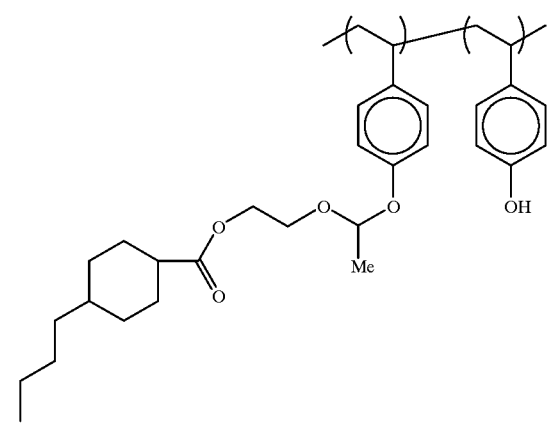
(A-29)
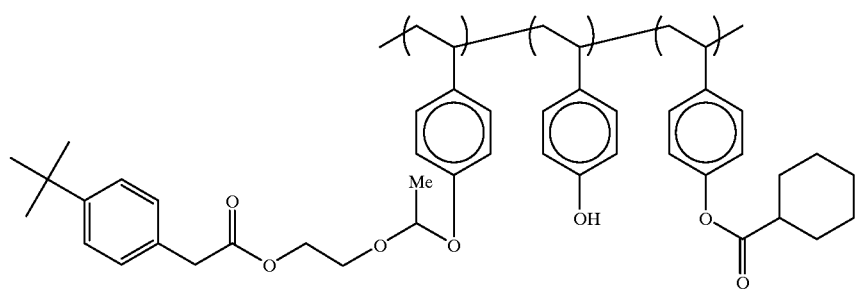
(A-30)
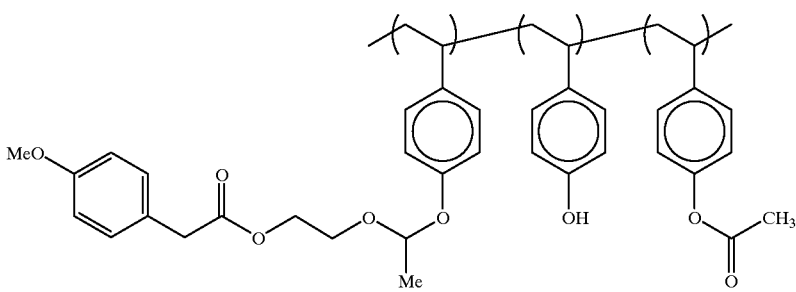
(A-31)
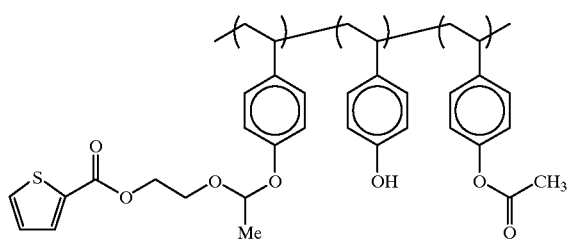
(A-32)
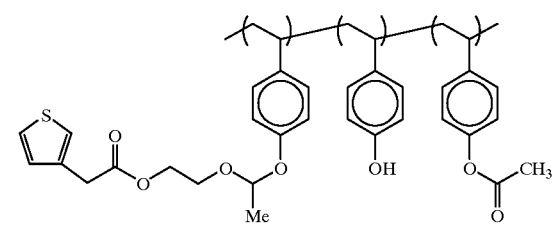
(A-33)

-continued
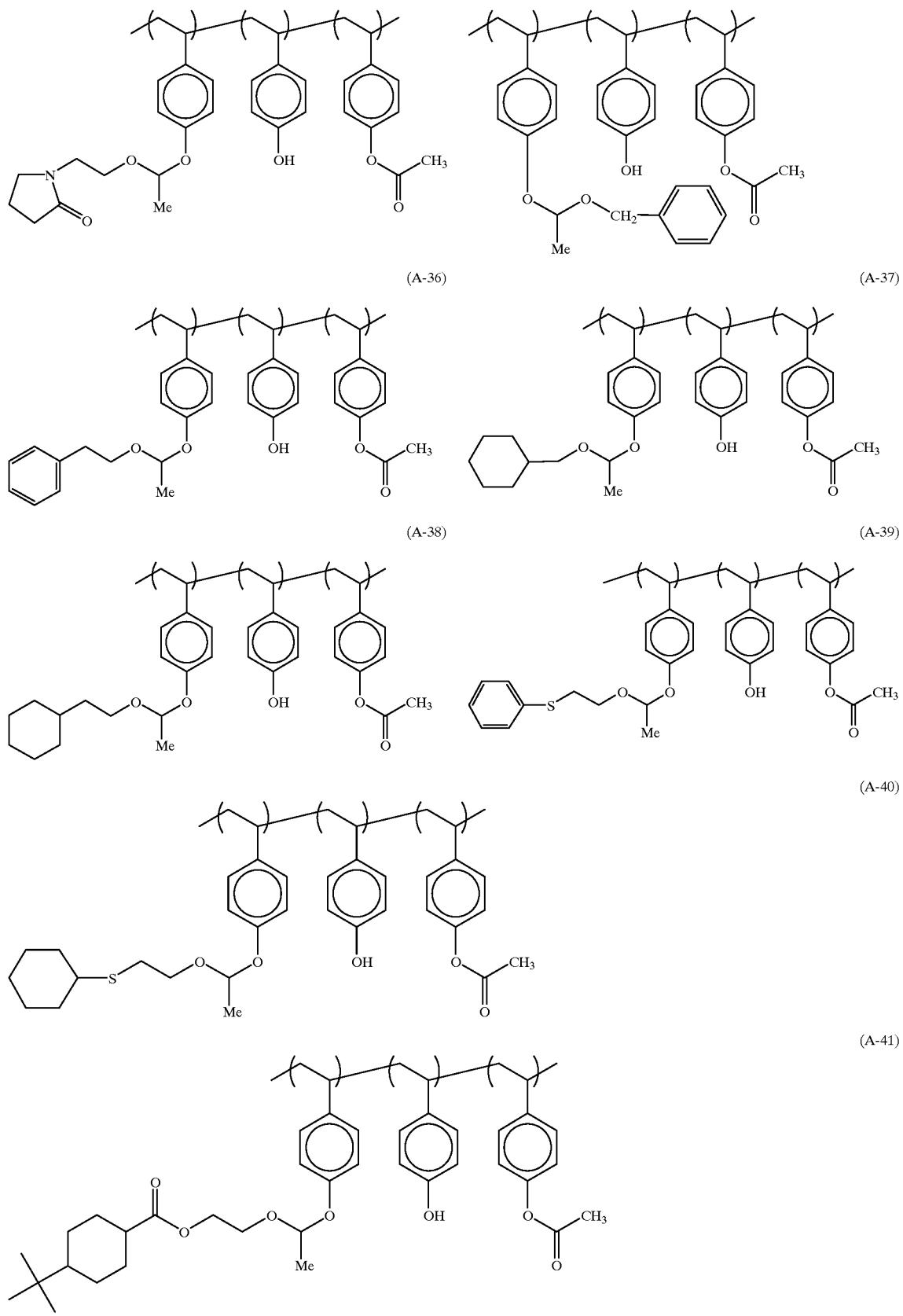

(A-42)
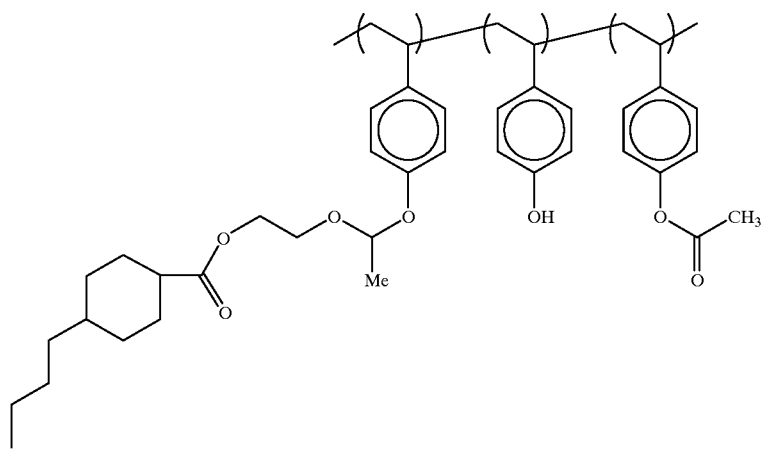
(A-43) (A-44)
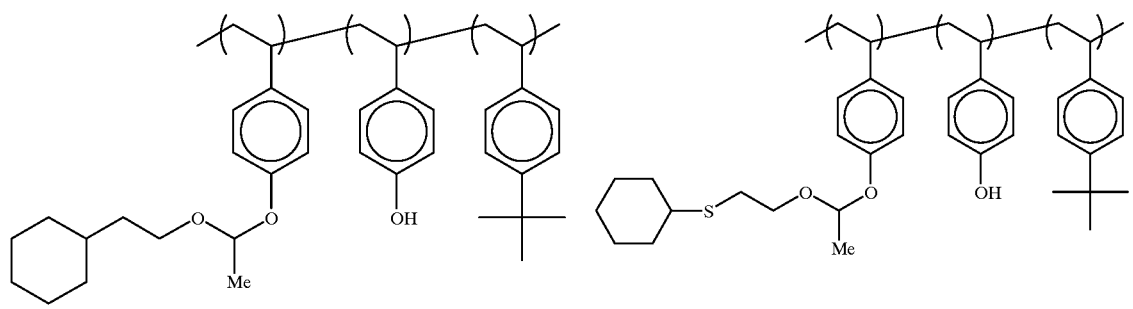
(A-45) (A-46)
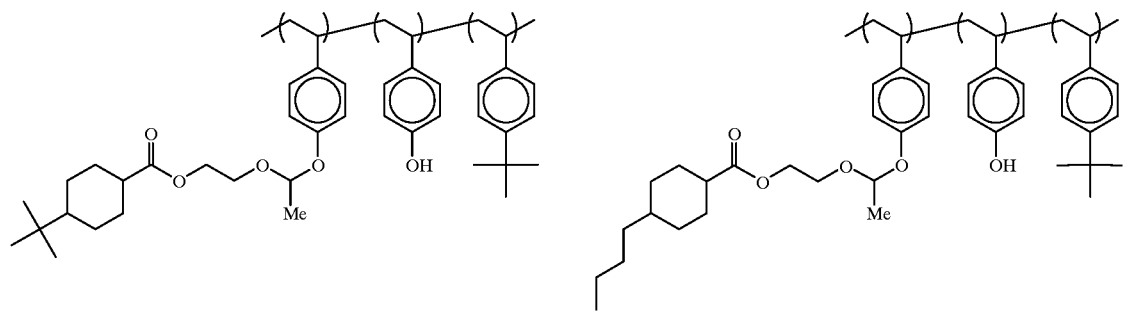
(A-47) (A-48)
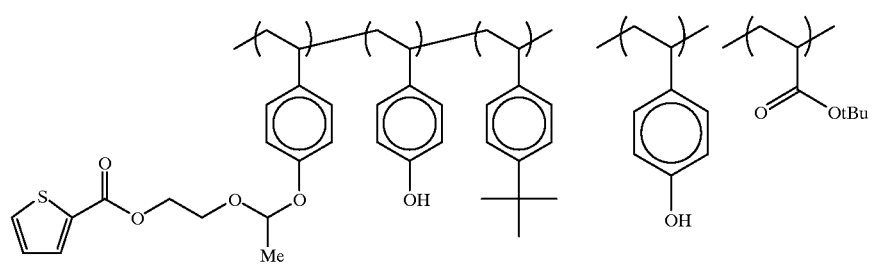

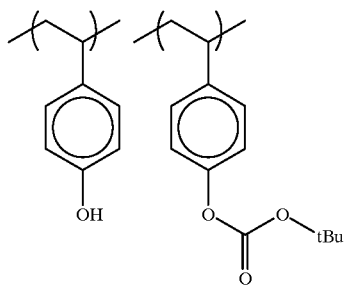
(A-49)

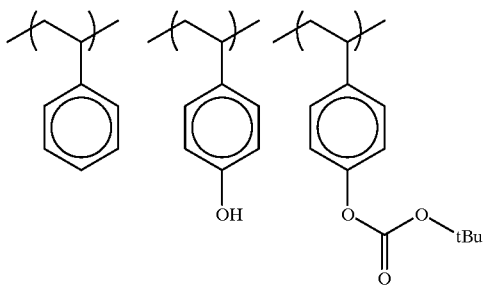
(A-50)

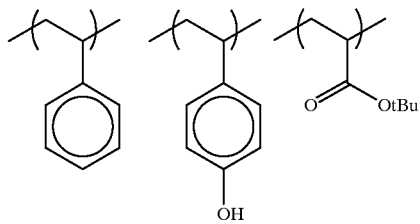
(A-51)

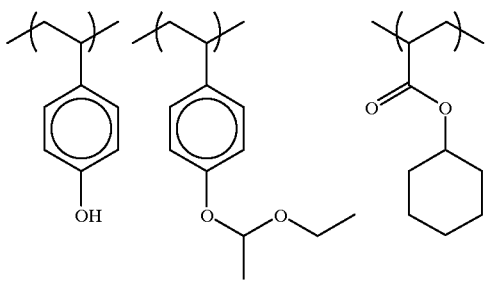
(A-52)

In the above-described formulae, Me represents a methyl group, Et represents an ethyl group, n-Bu represents a n-butyl group, iso-Bu represents an isobutyl group and t-Bu represents a tert-butyl group.

In case of using an acetal group as the acid-decomposable group, crosslinking portions connected with polyfunctional acetal groups may be introduced into the polymer main chain by means of adding a polyhydroxy compound in the preparation step thereof in order to control an alkali-dissolution rate and to improve heat-resistance. The amount of the polyhydroxy compound added is preferably from 0.01 to 5 mol %, more preferably from 0.05 to 4 mol %, based on the content of hydroxy group in the resin. The polyhydroxy compound to be used has phenolic hydroxy groups or alcoholic hydroxy groups in an amount of 2 to 6, preferably from 2 to 4 and more preferably from 2 to 3.

Specific examples of the polyhydroxy compound are set forth below, bur the present invention should not be construed as being limited thereto.

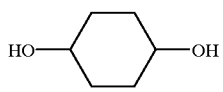

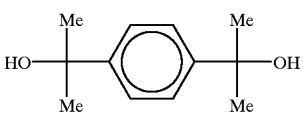

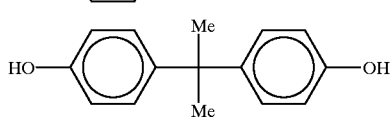

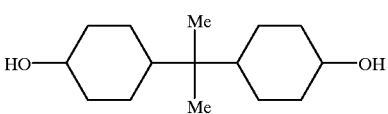

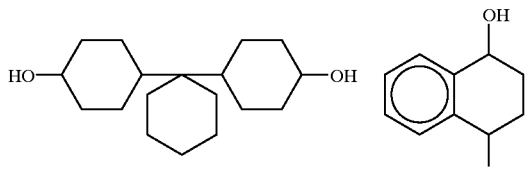

-continued

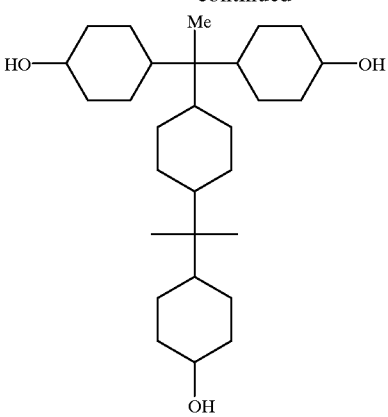

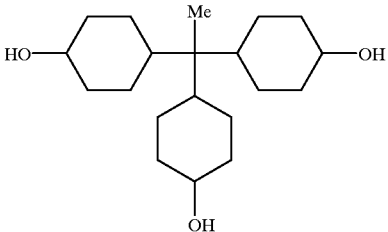

-continued

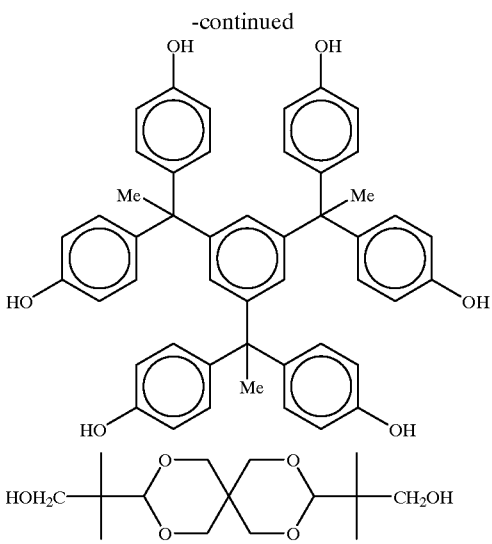

The weight average molecular weight (Mw) of the resin of component (A) having the acid-decomposable group is preferably in a range of from 2,000 to 300,000. If it is less than 2,000, decrease in a film thickness of the unexposed area during development is large and on the other hand, if it exceeds 300,000, a dissolution rate of the resin per se to alkali decreases, resulting in lowering sensitivity. The weight average molecular weight is measured by gel permeation chromatography and defined in terms of polystyrene.

Two or more of the resins of component (A) having the acid-decomposable group may be used in the photoresist composition of the present invention.

The amount of the resin of component (A) is ordinarily from 40 to 99% by weight, preferably from 60 to 98% by weight, based on the solid content of the first composition of the present invention.

[4] (D) A compound having a molecular weight of not more than 3,000 which decomposes by the action of an acid to increase solubility in an alkaline developing solution (Component (D)):

The component (D) is the indispensable component in the second composition of the present invention, and is incorporated into the first component, if desired. The compound of component (D) is a low molecular weight compound which has a group decomposable with an acid, whose solubility in an alkaline developing solution is increased by the action of an acid, and which has a molecular weight of not more than 3,000, preferably from 200 to 2,000, and more preferably from 300 to 1,500. The compound of component (D) functions as a compound for inhibiting dissolution of the unexposed portion in the alkaline developing solution. The term "acid-decomposable dissolution-inhibiting compound" has the same meaning as the compound of component (D) hereinafter.

The compound of component (D), i.e., acid-decomposable dissolution-inhibiting compound is preferably a compound containing at least two acid-decomposable groups in its structure wherein at least 8 connecting atoms other than acid-decomposable group are interposed between the acid-decomposable groups which are separated from each other at the greatest distance.

Preferred examples of the acid-decomposable dissolution-inhibiting compound include (a) a compound containing at least two acid-decomposable groups in its structure wherein at least 10, preferably at least 11, more preferably at least 12 connecting atoms other than acid-decomposable group are interposed between the acid-decomposable groups which are separated from each other at the greatest distance, and (b) a compound containing at least three acid-decomposable groups in its structure wherein at least 9, preferably at least 10, more preferably at least 11 connecting atoms other than acid-decomposable group are interposed between the acid-decomposable groups which are separated from each other at the greatest distance.

The upper limit of the number of the above-described connecting atoms is preferably 50, more preferably 30.

When the acid-decomposable dissolution-inhibiting compound contains three or more, preferably four or more acid-decomposable groups, even two acid-decomposable groups, its dissolution-inhibiting function to the alkali-soluble resin is remarkably enhanced as far as these acid-decomposable groups are separated from each other at the predetermined distance.

The distance between the acid-decomposable groups is represented by the number of connecting atoms interposed therebetween excluding the acid-decomposable groups. For, instance, in the case of compounds (1) and (2) described below, the distance between the acid-decomposable groups is four connecting atoms, respectively. In the case of compound (3) described below, the distance between the acid-decomposable groups is 12 connecting atoms.

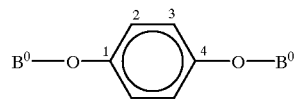

(1)

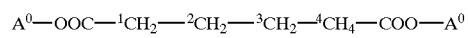

(2)

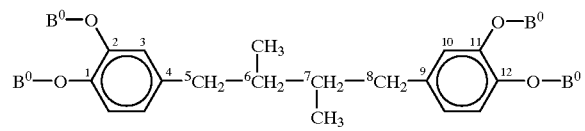

(3)

Acid-decomposable group: —COO—$A^0$ or —O—$B^0$

Further, the acid-decomposable dissolution-inhibiting compound may have a plurality of acid-decomposable groups on one benzene ring. Preferably, it is a compound formed by a skeleton having one acid-decomposable group on one benzene ring.

A group containing the acid-decomposable group, i.e., a group containing —COO—$A^0$ group or —O—$B^0$ group is preferably a group represented by formula —$R^0$—COO—$A^0$ or —Ar—O—$B^0$.

In the above formulae, $A^0$ represents —$C(R^{01})(R^{02})(R^{03})$, —$Si(R^{01})(R^{02})(R^{03})$ or —$C(R^{04})(R^{05})$—O—$R^{06}$, and $B^0$ represents —$A^0$ or —CO—O—$A^0$.

$R^{01}$, $R^{02}$, $R^{03}$, $R^{04}$ and $R^{05}$, which may be the same or different, each represents a hydrogen atom, an alkyl group, a cycloalkyl group, an alkenyl group or an aryl group, and $R^{06}$ represents an alkyl group or an aryl group. However, at least two of $R^{01}$ to $R^{03}$ are not hydrogen atoms; and two of $R^{01}$ to $R^{03}$ may be bonded to each other to form a ring, and two of $R^{04}$ to $R^{06}$ may be bonded to each other to form a ring. $R^0$ represents an aliphatic or aromatic hydrocarbon group having a valence of 2 or higher, which may be substituted, and —Ar— represents a monocyclic or polycyclic aromatic group having a valence of 2 or higher, which may be substituted.

Preferred examples of the alkyl group include those having from 1 to 4 carbon atoms, such as methyl, ethyl, propyl, n-butyl, sec-butyl and tent-butyl. Preferred examples of the cycloalkyl group include those having from 3 to 10 carbon atoms, such as cyclopropyl, cyclobutyl, cyclohexyl and adamantly.

Preferred examples of the alkenyl group include those having from 2 to 4 carbon atoms, such as vinyl, propenyl, allyl and butenyl.

Preferred examples of the aryl group include those having from 6 to 14 carbon atoms, such as phenyl, xylyl, tolyl, cumenyl, naphthyl and anthracenyl.

Examples of the substituent include a hydroxy group, a halogen atom (e.g., fluorine, chlorine, bromine and iodine), a nitro group, a cyano group, the above-described alkyl group, an alkoxy group such as methoxy, ethoxy, hydroxyethoxy, propoxy, hydroxypropoxy, n-butoxy, isobutoxy, sec-butoxy and tert-butoxy, an alkoxycarbonyl group such as methoxycarbonyl and ethoxycarbonyl, an aralkyl group such as benzyl, phenethyl and cumyl, an aralkyloxy group, an acyl group such as formyl, acetyl, butyryl, benzoyl, cyanamyl and valeryl, an acyloxy group such as butyryloxy, the above-described alkenyl group, an alkenyloxy group such as vinyloxy, propenyloxy, allyloxy and butenyloxy, the above-described aryl group, an aryloxy group such as phenoxy, and an aryloxycarbonyl group such as benzoyloxy.

Preferred examples of the acid-decomposable group include a silyl ether group, a cumyl ester group, an acetal group, a tetrahydropyranyl ether group, an enol ether group, an enol ester group, a tertiary alkyl ether group, a tertiary alkyl ester group and a tertiary alkylcarbonate group. More preferred examples thereof include a tertiary alkyl ester group, a tertiary alkylcarbonate group, a cumyl ester group and a tetrahydropyranyl ether group.

The compound of component (D) includes compounds protected by connecting a part or all of phenolic hydroxy groups in polyhydroxy compounds as described, for example, in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, JP-A-4-271349, JP-A-5-45869, JP-A-5-158233, JP-A-5-224409, JP-A-5-257275, JP-A-5-297581, JP-A-5-297583, JP-A-5-303197, JP-A-5-303200, JP-A-5-341510, via the above-described group of —R°—COO—A° or —B°. More preferred compounds are those formed from the polyhydroxy compounds as described in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, JP-A-5-224409, JP-A-5-297581, JP-A-5-297583, JP-A-5-303197, JP-A-5-303200, JP-A-5-34510.

Specific examples of the preferred compound skeleton for the compound of component (D) are set forth below, but the present invention should not be construed as being limited thereto.

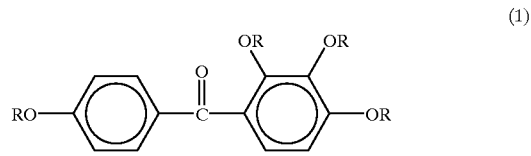
(1)

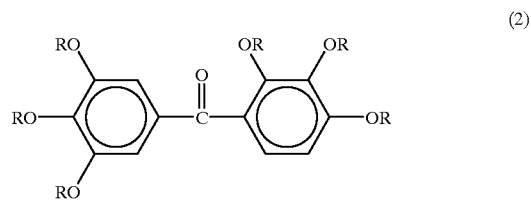
(2)

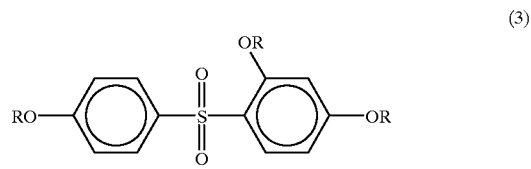
(3)

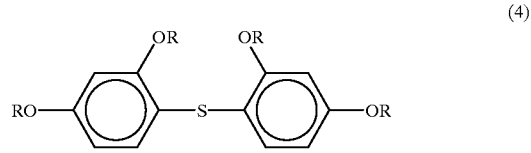
(4)

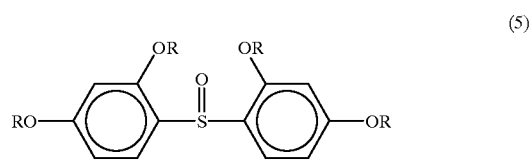
(5)

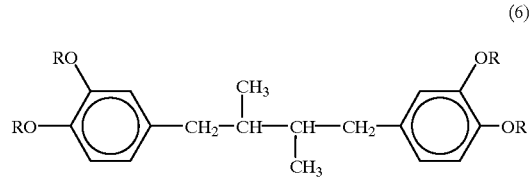
(6)

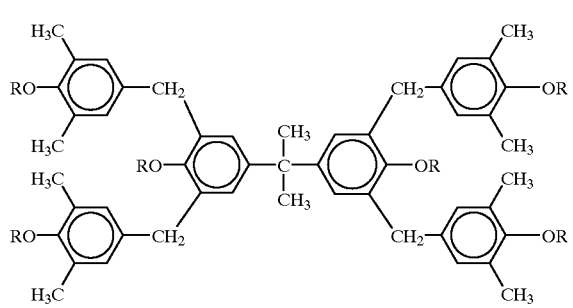
(7)

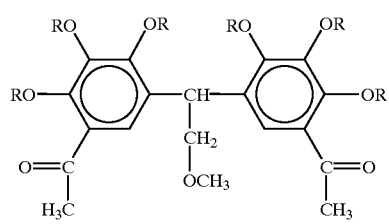
(8)
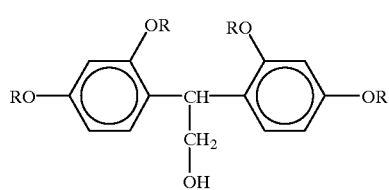
(9)
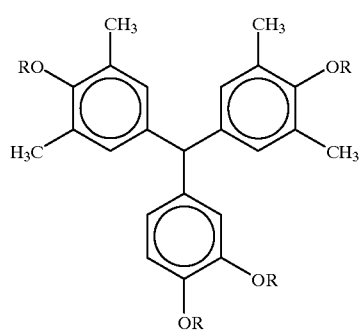
(10)
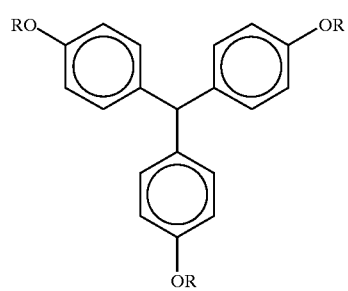
(11)
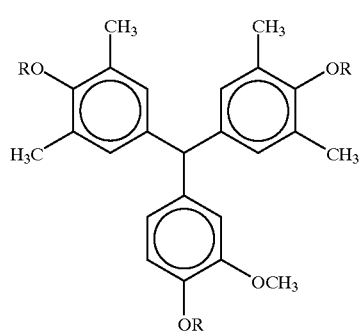
(12)
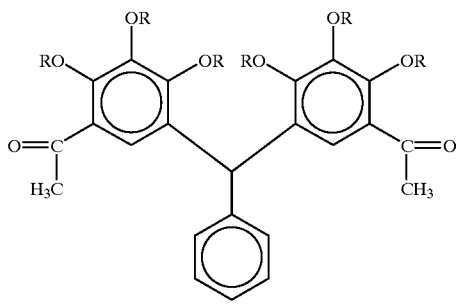
(13)
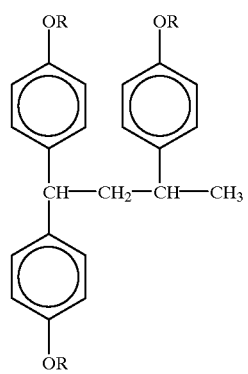
(14)
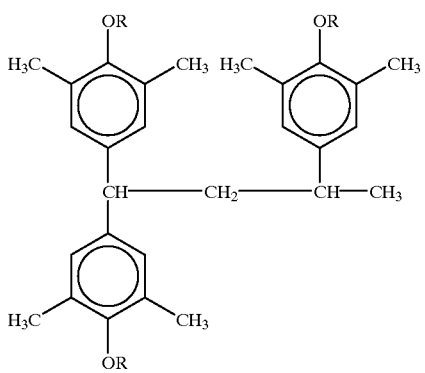
(15)
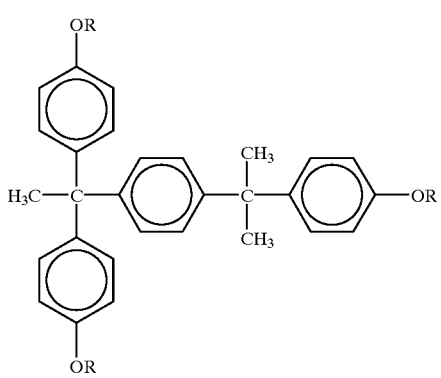
(16)

(17)
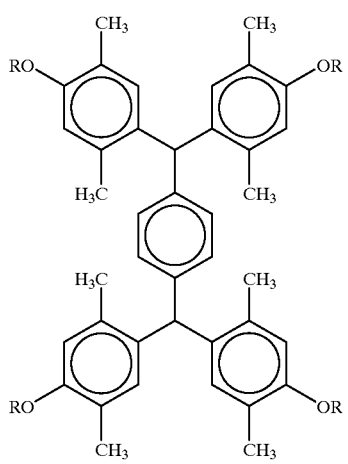
(18)
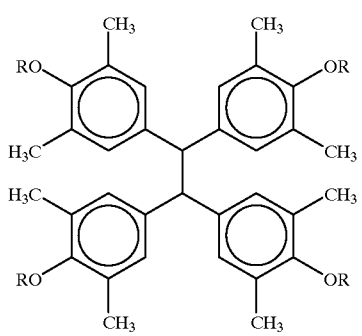
(19)
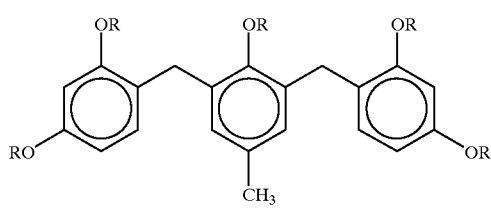
(20)
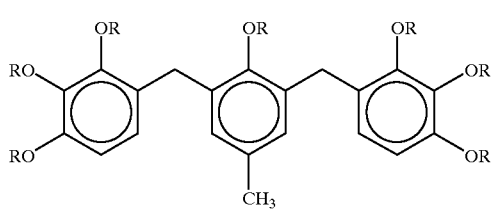
(21)
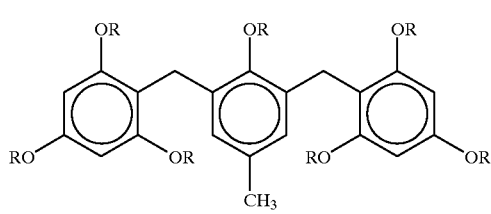
(22)
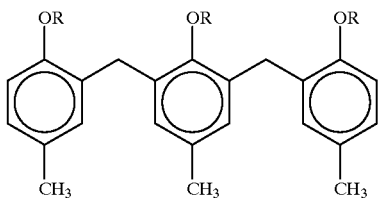
(23)
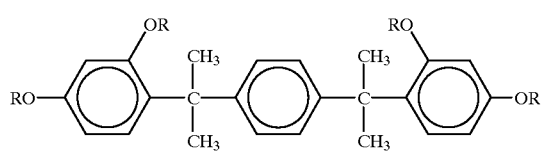
(24)
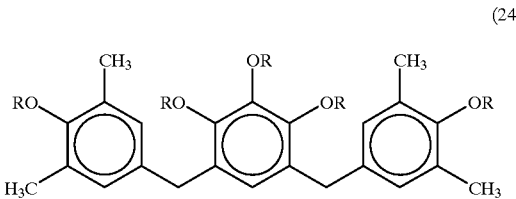
(25)
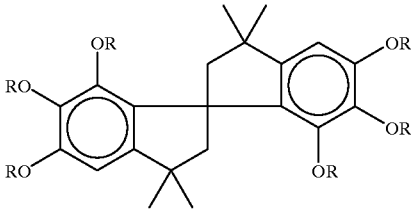
(26)
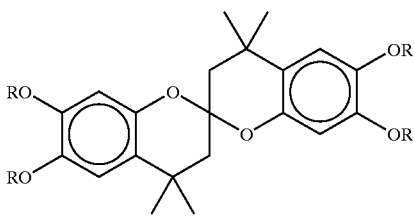
(27)
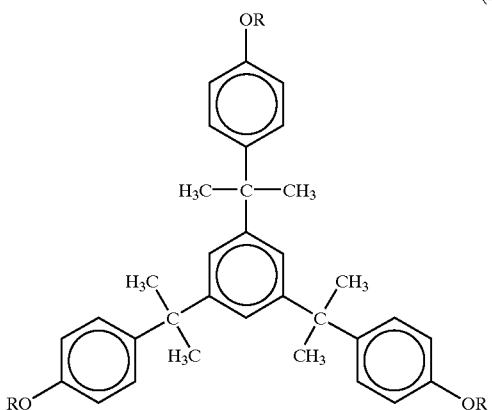

(28)
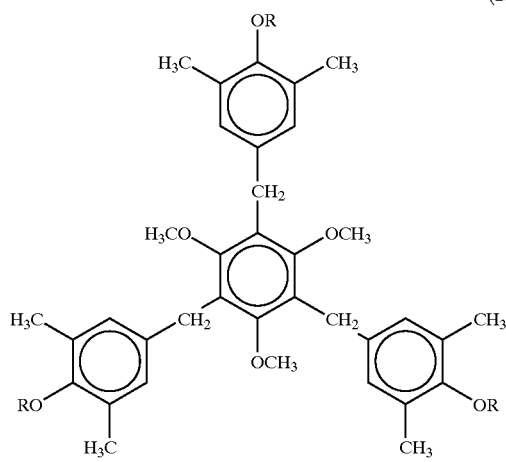
(32)
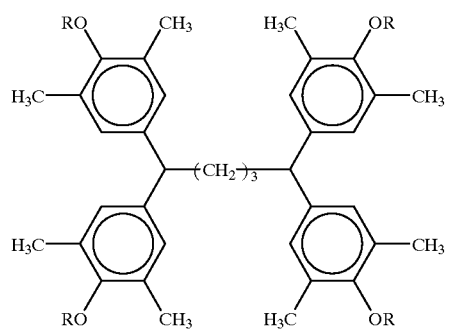
(33)
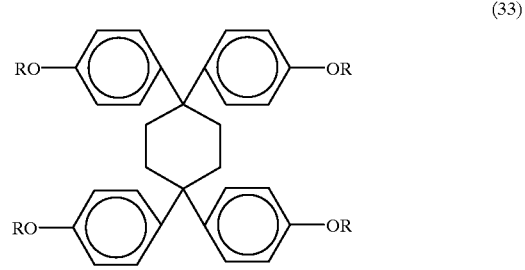
(29)
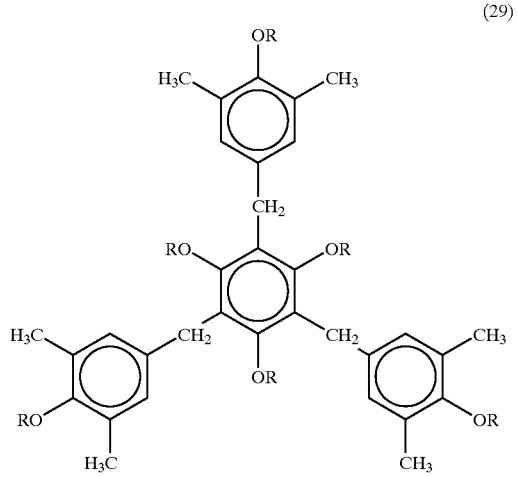
(34)
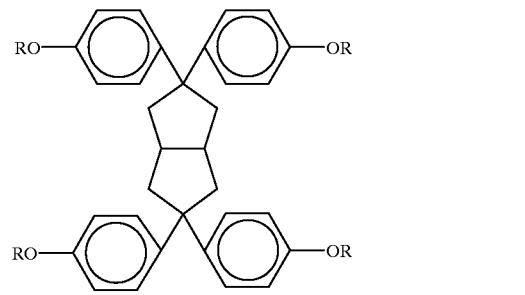
(30)
(35)
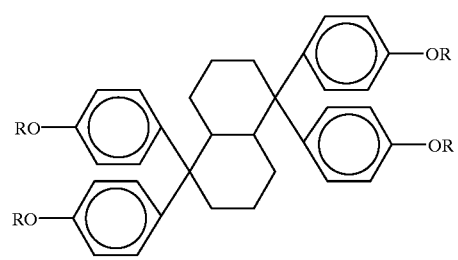
(31)
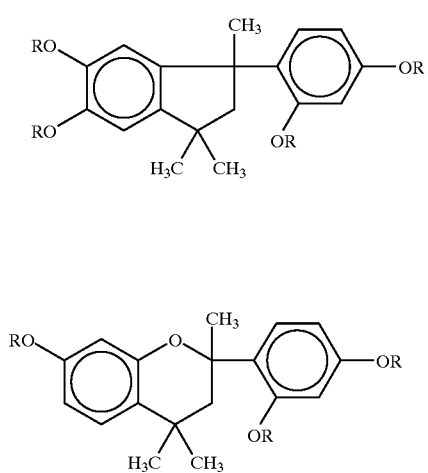
(36)
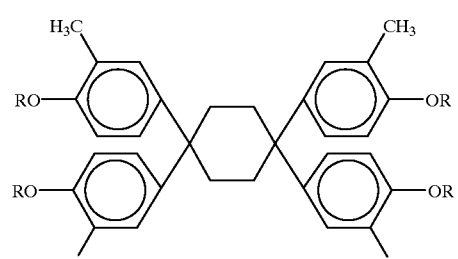

(37)
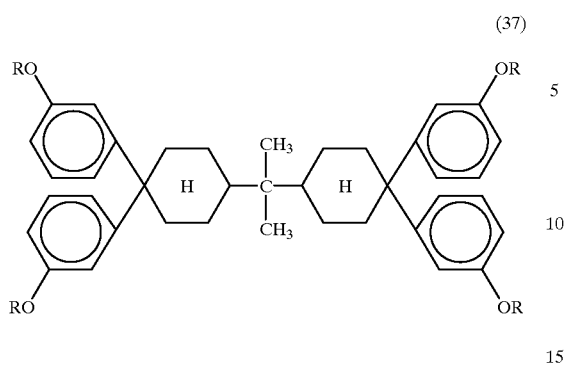
(40)
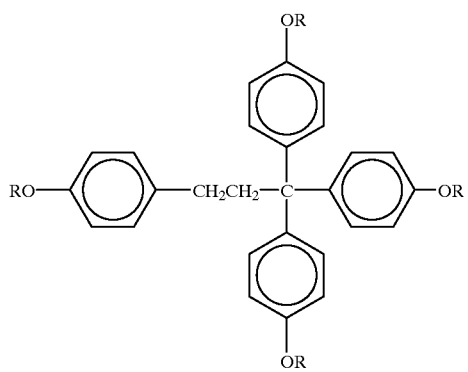
(38)
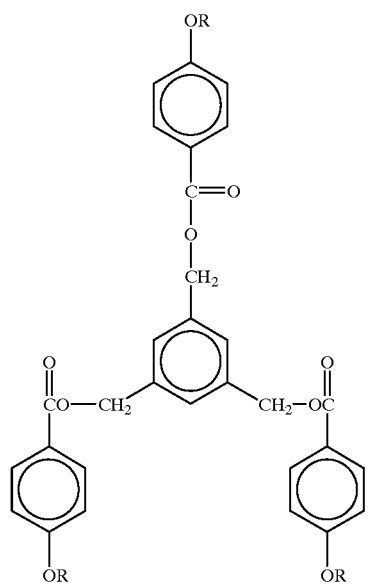
(41)
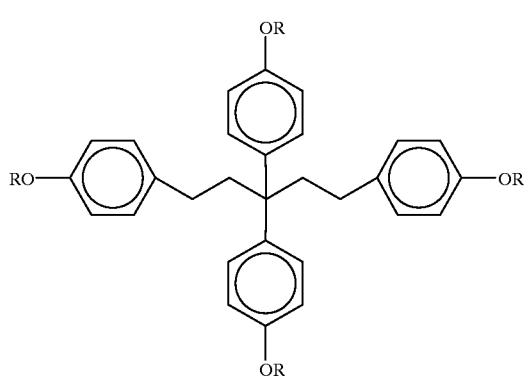
(42)
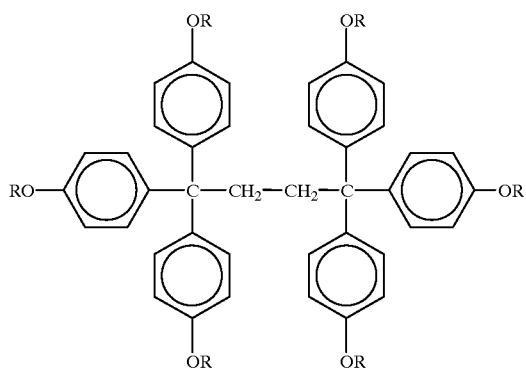
(39)
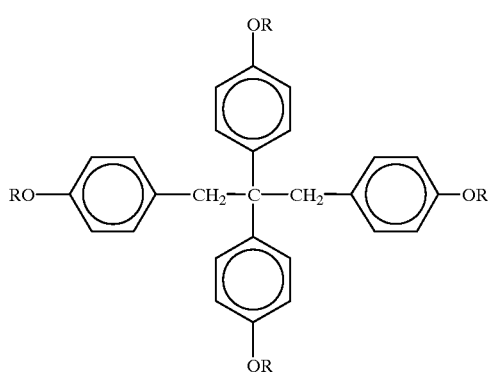
(43)

-continued (44)

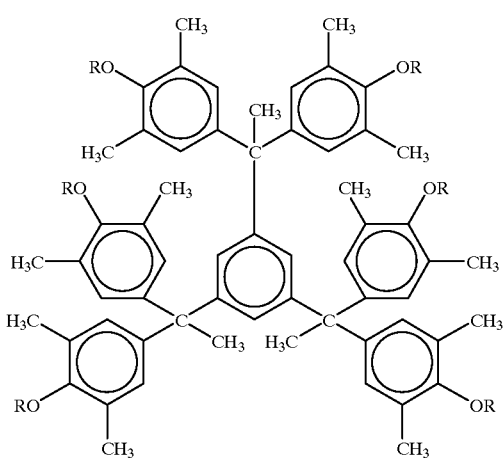

In the above-described formulae of Compounds (1) to (44), R represents a hydrogen atom, —CH$_2$COOC(CH$_3$)$_2$C$_6$H$_5$, —CH$_2$COOC$_4$C$_9$-tert, —COOC$_4$C$_9$-tert or

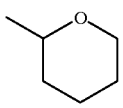

with the proviso that at least two or three, depending on the structure, of R's are groups other than a hydrogen atom and R's may be the same or different.

In the first composition, the content of the component (D) is preferably from 3 to 45% by weight, more preferably from 5 to 30% by weight, and still more preferably from 10 to 20% by weight, based on the solid content of the first composition.

The content of the component (D) in the second composition is same as that in the first composition.

[5] (E) An alkali-soluble resin (Component (E)):

The alkali-soluble resin of component (E) is the indispensable component in the second composition of the present invention. The alkali-soluble resin is a component which may added to the first composition of the present invention. The alkali-soluble resin of component (E) is a resin which is water-insoluble but soluble in an alkaline developing solution and used for controlling the solubility of the second composition in alkali. The alkali-soluble resin dose not substantially have the acid-decomposable group.

Examples of the resin of component (E) include novolak resin, hydrogenated novolak resin, acetone-pyrogallol resin, o-polyhydroxystyrene, m-polyhydroxystyrene, p-polyhydroxystyrene, hydrogenated polyhydroxystyrene, halogen- or alkyl-substituted polyhydroxystyrene, hydroxystyrene/N-substituted maleimide copolymer, o/p- or m/p-hydroxystyrene copolymer, partially O-alkylated product of hydroxyl group in polyhydroxystyrene (e.g., 5 to 30 mol % O-methylated product, O-(1-methoxy)ethylated product, O-(1-ethoxy)ethylated product, O-2-tetrahydropyranylated product, O-(tert-butoxycarbonyl) methylated product), partially O-acylated product of hydroxyl group in polyhydroxystyrene (e.g., 5 to 30 mol % O-acetylated product, O-(tert-butoxy)carbonylated product), styrene/maleic anhydride copolymer, styrene/hydroxystyrene copolymer, α-methylstyrene/hydroxystyrene copolymer, carboxyl group-containing methacrylic resin and derivative thereof, and polyvinyl alcohol derivative. However, the present invention should not be construed as being limited thereto.

Particularly preferred examples of the alkali-soluble resin include novolak resin, o-polyhydroxystyrene, m-polyhydroxystyrene, p-polyhydroxystyrene and copolymer thereof, alkyl-substituted polyhydroxystyrene, partially O-alkylated product of polyhydroxystyrene, partially O-acylated product of polyhydroxystyrene, styrene/hydroxystyrene copolymer, and α-methylstyrene/hydroxystyrene copolymer. The above-described novolak resin can be obtained by subjecting a specific monomer as a main component to an addition condensation reaction with an aldehyde in the presence of an acid catalyst.

The weight average molecular weight of the novolak resin is preferably in a range of from 1,000 to 30,000. If the weight average molecular weight thereof is lower than 1,000, decrease in a film thickness of the unexposed area during development is large. On the other hand, if the weight average molecular weight thereof exceeds 30,000, a developing rate decreases. A particularly preferred range of the weight average molecular weight of the novolak resin is from 2,000 to 20,000.

The poly(hydroxystyrene)s and derivatives and copolymers thereof described above other than the novolak resin each has a weight average molecular weight of ordinarily not less than 2,000, preferably from 5,000 to 200,000, more preferably from 8,000 to 100,000. Further, from a standpoint of improvement in heat resistance of the resist film, the weight average molecular weight is preferably not less than 10,000.

The weight average molecular weight used herein means that measured by gel permeation chromatography and defined in terms of polystyrene.

In the composition of the present invention, the alkali-soluble resins may be used as a mixture of two or more thereof.

The content of the alkali-soluble resin is preferably from 40 to 97% by weight, more preferably from 60 to 90% by weight, based on the solid content of the second composition.

[6] (F) A nitrogen-containing basic compound (component (F)):

The nitrogen-containing basic compound of component (F) which is used in the positive photoresist composition of the present invention is preferably a compound which has basicity stronger than phenol. Among others, the nitrogen-containing basic compounds having a structure represented by formulae (A), (B), (C), (D) and (E) shown below are preferred. By the use of the nitrogen-containing basic compound, change in performance of the photoresist composition with the lapse of time from exposure to post-baking is restrained.

(A)

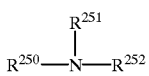

wherein R$^{250}$, R$^{251}$ and R$^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsub stituted aryl group having from 6 to 20 carbons atoms, or R$^{251}$ and R$^{252}$ may be combined with each other to form a ring;

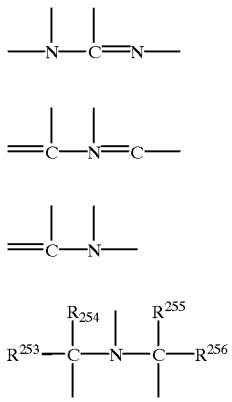

wherein R$^{253}$, R$^{254}$, R$^{255}$ and R$^{256}$, which may be the same or different, each represents an alkyl group having from 1 to 6 carbon atoms.

Preferred examples of the nitrogen-containing basic compound include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, a substituted or unsubstituted aminoalkylmorpholine, a mono- di- or tri-amine, a substituted or unsubstituted aniline, a substituted or unsubstituted piperidine and a mono- or diethanolamine. Examples of the substituent includes preferably an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

More preferred examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo[4,3,0]nona-5-ene, 1,8-diazabicyclo[5,4,0] undeca-7-ene, 2,4,5-triphenylimidazole, tri(n-butyl)amine, tri(n-octyl)amine, N-phenyldiethanolamine, N-hydroxyethylpiperidine, 2,6-diisopropylamine, N-cyclohexyl-N'-morpholinoethylthiourea and N-hydroxyethylmorpholine. However, the present invention should not be construed as being limited thereto.

Of these compounds, 1,5-diazabicyclo[4,3,0]nona-5-ene, 1,8-diazabicyclo[5,4,0]undeca-7-ene, 2,4,5-triphenylimidazole, tri(n-butyl)amine, tri(n-octyl)amine, N-phenyldiethanolamine, N-hydroxyethylpiperidine, 2,6-diisopropylamine, N-cyclohexyl-N'-morpholinoethylthiourea and N-hydroxyethylmorpholine are particularly preferred.

The nitrogen-containing basic compounds are used individually or in combination of two or more thereof.

The amount of the nitrogen-containing basic compound used is ordinarily from 0.001 to 10% by weight, preferably from 0.01 to 5% by weight, based on the solid content of the photoresist composition. If the amount used is less than 0.001% by weight, the effect owing to the addition of the nitrogen-containing basic compound can not be obtained, whereas if it exceeds 10% by weight, reduction in sensitivity or deterioration in developing property of the unexposed area is liable to occur.

[7] (G) A fluorine-base or silicon-base surface active agent (Component (G)):

It is preferred that the photoresist composition of the present invention contains Component (G). The surface active agent of component (G) is selected from a fluorine-base surface active agent, a silicon-base surface active agent and a surface active agent having both a fluorine atom and a silicon.

The positive photoresist composition containing the fluorine-base or silicon-base surface active agent according to the present invention is excellent in sensitivity, resolution, adhesion property to a substrate and dry etching resistivity when an exposure light source having a wavelength of 250 nm or less, particularly 220 nm or less is used. Also, the occurrence of particles during the preservation of the resist composition is restrained. Further, a resist pattern with less development defect and scum is obtained.

Examples of the fluorine-base or silicon-base surface active agent include those described, for example, in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988. Commercially available surface active agents are also employed as they are.

Examples of commercially available surface active agents which can be used include fluorine-base surface active agents and silicon-base surface active agents, for example, F-Top EF301 and EF303 (manufactured by Shin Akita Chemical Co., Ltd.), Florard FC430 and FC431 (manufactured by Sumitomo 3M Ltd.), Megafac F171, F173, F176, F189 and R08 (manufactured by Dainippon Ink and Chemicals, Inc.), Serflon S-382, SC101, SC102, SC103, SC104, SC105 and SC106 (manufactured by Asahi Glass Co., Ltd.), and TROYSOL S-366 (manufactured by TROY CHEMICAL CO., LTD.). Also, polysiloxane polymer KP-341 (manufactured by Shin-Etsu Chemical Co., Ltd.) is employed as the silicon-base surface active agent.

The amount of the fluorine-base or silicon-base surface active agent added is ordinarily from 0.001 to 2% by weight, preferably from 0.01 to 1% by weight, based on the solid content of the photoresist composition of the present invention. The surface active agents may be used individually or in combination of two or more thereof.

[8] Other components usable in the photoresisit composition of the present invention:

The positive photoresist composition of the present invention may further contain, if desired, a dye, a pigment, a plasticizer, a surface active agent other than the fluorine-base or silicon-base surface active agent described above, a photosensitizer, a compound having two or more phenolic OH groups, which accelerates the solubility in a developing solution, and the like.

The compound containing two or more phenolic OH groups, which can be used in the present invention, is preferably a phenol compound having a molecular weight of not more than 1,000. The phenol compound needs to contain at least two phenolic hydroxyl groups in its molecule. However, if the number of phenolic hydroxyl groups contained in the phenol compound exceeds 10, the desired effect for improving development latitude is lost. Further, if the ratio of phenolic hydroxyl group to aromatic ring is less than 0.5, the dependence on film thickness becomes large and the development latitude tends to narrow. On the other hand, it is not preferred that the ratio exceeds 1.4, since stability of the resulting photoresist composition deteriorates and it is difficult to obtain high resolution and good dependence on film thickness.

The amount of the phenol compound added is preferably from 2 to 50% by weight, more preferably from 5 to 30% by weight, based on the weight of the alkali-soluble resin. If the amount of the phenol compound added exceeds 50% by weight, development residue increases adversely and a new problem disadvantageously arises such that the pattern deforms during the development.

The above-described phenol compound having a molecular weight of not more than 1,000 can be easily synthesized by one skilled in the art making reference to the methods described, for example, in JP-A-4-122938, JP-A-2-28531, U.S. Pat. No. 4,916,210 and European Patent 219,294.

Specific examples of the phenol compound are set forth below, however, the compound which can be used in the present invention should not be construed as being limited thereto.

Resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucoside, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenylsulfone, tris(4-hydroxyphenyl)methane, 1,1-bis(4-hydroxyphenyl)cyclohexane, 4,4-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane and para[α,α,α',α'-tetrakis(4-hydroxyphenyl)]xylene.

Each of the components contained in the photoresist composition of the present invention are described above.
<Preparation of the positive photoresist composition and use thereof>

A method for the preparation of positive photoresist composition and a method for the use thereof will be described below.

The photoresist composition of the present invention is dissolved in a solvent which can dissolve the above-described respective components, and then coated on a support. Examples of the solvent used includes preferably ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, propylene glycol monoethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran. The solvents may be used individually or in combination of two or more thereof.

Of the solvents described above, 2-heptanone, γ-butyrolactone, ethylene glycol monomethyl ether, ethylene glycol monoethyl ether, ethylene glycol monoethyl ether acetate, propylene glycol monomethyl ether, propylene glycol monomethyl ether acetate, propylene glycol monoethyl ether acetate, methyl lactate, ethyl lactate, methyl methoxypropionate, ethyl ethoxypropionate, N-methylpyrrolidone and tetrahydrofuran are more preferably used.

It is preferred to add the fluorine-base or silicon-base surface active agent of component (G) described above to the solvent.

Further, a surface active agent other than the fluorine-base or silicon-base surface active agent of component (G) may be added. Specific examples of such a surface active agent include a nonionic surface active agent, for example, a polyoxyethylene alkyl ether such as polyoxyethylene lauryl ether, polyoxyethylene stearyl ether, polyoxyethylene cetyl ether and polyoxyethylene oleyl ether, a polyoxyethylene alkylaryl ether such as polyoxyethylene octylphenol ether and polyoxyethylene nonylphenol ether, a polyoxyethylene/polyoxypropylene block copolymer, a sorbitan fatty acid ester such as sorbitan monolaurate, sorbitan monopalmitate, sorbitan monostearate, sorbitan monooleate, sorbitan trioleate and sorbitan tristearate, and a polyoxyethylene sorbitan fatty acid ester such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate, and an acrylic or methacrylic (co)polymer (Polyflow No. 75 and NO. 95 manufactured by Kyoei Yusi Kagaku Kogyo Co., Ltd.).

The amount of the surface active agent added is ordinarily not more than 2 parts by weight, preferably not more than 1 part by weight, based on 100 parts by weight of the solid content of the photoresist composition of the present invention.

The above-described photoresist composition is coated on a substrate (e.g., silicon/silicon dioxide coating) for use in the production of a precision integrated circuit element by an appropriate coating means such as a spinner or coater, exposed through a predetermined mask, baked and developed to thereby obtain a good resist pattern.

A developing solution which can be used for the photoresist composition according to the present invention is an alkaline aqueous solution of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcohol amine such as dimethylethanolamine and triethanolamine, a quaternary ammonium salt such as tetramethylammonium hydroxide and tetraethylammonium hydroxide, and a cyclic amine such as pyrrole and piperidine.

To the alkaline aqueous solution, an appropriate amount of an alcohol or surface active agent may be added.

The positive photoresist composition of the present invention is improved in resolution and process allowance such as exposure margin and depth of focus in a lithographic technology using a light source having a short wavelength capable of conducting the ultra fine fabrication and a chemical amplification-type positive photoresist. Further, it exhibits the excellent performance when an electron beam is used as a light source for exposure.

EXAMPLE

The present invention will be described in greater detail with reference to the following examples, however, the present invention should not be construed as being limited thereto.

Synthesis Example 1

Synthesis of compound generating a fluorine-substituted carboxylic acid (Component (B))

(1)<Synthesis of Bis(4-tert-amylphenyl)iodonium heptafluorobutyrate (Compound (I-3))>

In 500 ml of methanol was dissolved 10 g of bis(4-tert-amylphenyl)iodonium iodide. To the solution was added 4.44 g of silver oxide and the mixture was stirred for 4 hours at a room temperature. The reaction mixture was filtered to remove the silver compound and 4.67 g of heptafluorobutyric acid was added to the filtrate. The solution was concentrated and the resulting solid substance was recrystallized from a solvent mixture of acetone and water (4:6) to obtain 6 g of the desired compound.

(2) In the same manner as described in item (1) above except for using the corresponding iodonium iodide and carboxylic acid, Compounds (I-1) to (I-24) of component (B) and compounds which generate a carboxylic acid which is not substituted with a fluorine atom (Compound (B'-3) and Compound (B'-4)) shown below were synthesized.

(3)<Synthesis of Triphenylsulfonium nonafluoropentanoate (Compound (II-4)>

In 500 ml of methanol was dissolved 20 g of triphenylsulfonium iodide. To the solution was added 12.5 g of silver oxide and the mixture was stirred for 4 hours at a room temperature. The reaction mixture was filtered to remove the silver compound and 14.9 g of nonafluoropentanoic acid was added to the filtrate. The solution was concentrated. To the resulting oily substance was added 300 ml of diisopropyl ether, the mixture was thoroughly stirred and then the diusopropyl ether was removed by decantation. The procedure removing diisopropyl ether was repeated again and the resulting oily substance was dried under a reduced pressure to obtain 18 g of the desired compound.

(4) In the same manner as described in item (3) above except for using the corresponding sulfonium iodide and carboxylic acid, Compounds (II-1) to (II-48) of component (B) and compounds which generate a carboxylic acid which is not substituted with a fluorine atom (Compound (B'-1) and Compound (B'-2)) shown below were synthesized.

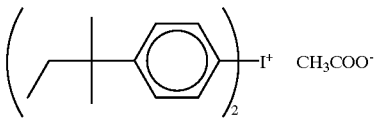
(B'-1)

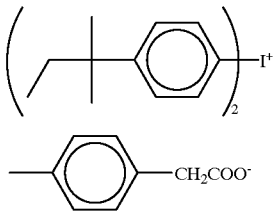
(B'-2)

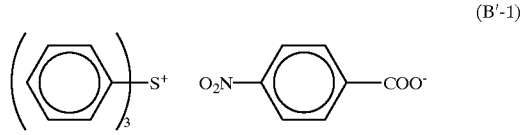
(B'-3)

(B'-4)

(5)<Synthesis of Triarylsulfonium heptafluorobutyrate (Mixture containing Compound (II-24) and Compound (III-3) as the main component>

To 10 g of a 45% aqueous solution of triphenylsulfonium chloride (manufactured by Fluka Co., Ltd.) (mixture of triarylsulfonium chloride) was added 100 ml of methanol. To the solution was added 3.44 g of silver oxide and the mixture was stirred for 4 hours at a room temperature. The reaction mixture was filtered to remove the silver compound and 3.38 g of heptafluorobutyric acid was added to the filtrate. The solution was concentrated. To the resulting oily substance was added 300 ml of diisopropyl ether, the mixture was thoroughly stirred and then the diisopropyl ether was removed by decantation. The procedure removing diisopropyl ether was repeated again and the resulting oily substance was dried under a reduced pressure to obtain 4.2 g of the desired compound.

(6)<Synthesis of N-Pentafluorobenzoyloxyphthalimide (Compound (IV-1) )>

To 200 ml of dehydrated tetrahydrofuran was dissolved 10 g of N-hydroxyphthalimide and the solution was cooled to 0° C. To the solution was added dropwise 13.6 g of pentafluorobenzoyl chloride. Then, 7.0 g of triethylamine was added to the solution, followed by stirring for 2 hours. The reaction mixture was gradually added to 1.5 liters of distilled water and the powder thus-deposited was collected by filtration and washed with water to obtain 17 g of the desired compound.

(7) In the same manner as described in item (6) above except for using the corresponding hydroxyimide and carboxylic acid chloride, Compounds (IV-2) to (IV-3) of component (B) were synthesized.

(8)<Synthesis of 2-Nitro-6-trifluoromethylbenzyl pentafluorobenzoate (Compound (V-2))>

To 150 ml of acetone were dissolved 10 g of 2-nitro-6-trifluoromethylbenzyl alcohol and 9.8 g of dicyclohexylamine and to the solution was gradually added dropwise 11.5 g of pentafluorobenzoyl chloride, followed by reacting at a room temperature for 2 hours. The reaction mixture was gradually poured into one liter of distilled water and the solid thus-deposited was collected by filtration and washed with distilled water to obtain 14 g of the desired compound.

(9) In the same manner as described in item (8) above except for reacting the corresponding benzyl alcohol and carboxylic acid chloride under a basic condition, Compounds (V-1) to (V-4) of component (B) were synthesized.

Further, Compounds (I-25), (I-31), (I-33), (II-49), (II-50), (II-56), (II-59), (II-61) and (II-64) were synthesized in the same manner as described above. However, in these compounds, each anion portion was synthesized by a telomer method and each compound was a mixture of not less than 50% by weight of the compound with the anion shown in each formula and compounds with an anion having a different number of carbon atoms (i.e., a different length of carbon chain).

Synthesis Example 2

Synthesis of resin (Component (A))

(1)<Synthesis of p-[1-(2-Cyclohexylethoxy)ethoxy]styrene/p-hydroxystyrene (30/70) (Resin (A-25))>

In 320 g of propylene glycol monomethyl ether acetate (PGMEA) was dissolved 70 g of poly(p-hydroxystyrene) (VP-8000, manufactured by Nippon Soda Co., Ltd.) with heating and the solution was subjected to dehydration by distillation under a reduce pressure and cooled to 20° C. To the solution were added 0.35 g of pyridinium p-toluenesulfonate and 22.4 g of 2-cyclohexylethanol. Then, 17.5 g of tert-butyl vinyl ether was gradually added to the solution, followed by reacting at 20° C. for 5 hours. To the reaction mixture were added 0.28 g of triethylamine and 320 ml of ethyl acetate and the mixture was washed three times with each 150 ml of distilled water. The solvent was distilled off to concentrate, the resulting oily substance was dissolved in 100 ml of acetone and the solution was gradually poured into 2 liters of distilled water. The powder thus-deposited was collected by filtration and dried to obtain 54 g of the desired compound.

(2)<Synthesis of p-[1-(2-Cyclohexylethoxy)ethoxy]styrene/p-acetoxystyrene/p-hydroxystyrene (30/10/60) (Resin (A-38))>

In 320 g of propylene glycol monomethyl ether acetate (PGMEA) was dissolved 70 g of poly(p-hydroxystyrene) (VP-8000, manufactured by Nippon Soda Co., Ltd.) with heating and the solution was subjected to dehydration by distillation under a reduce pressure and cooled to 20° C. To the solution were added 0.35 g of pyridinium p-toluenesulfonate and 22.4 g of 2-cyclohexylethanol. Then, 17.5 g of tert-butyl vinyl ether was gradually added to the solution, followed by reacting at 20° C. for 5 hours. To the reaction mixture was added 5.53 g of pyridine and then gradually added 5.9 g of acetic anhydride, followed by reacting at a room temperature for one hour. To the reaction mixture was added 320 ml of ethyl acetate and the mixture was washed three times with each 150 ml of distilled water. The solvent was distilled off to concentrate, the resulting oily substance was dissolved in 100 ml of acetone and the solution was gradually poured into 2 liters of distilled water. The powder thus-deposited was collected by filtration and dried to obtain 58 g of the desired compound.

(3) In the same manner as described in items (1) and (2) above, the following resins were synthesized:

Resin (A-3): p-(1-Ethoxyethoxy)styrene/p-hydroxystyrene (35/65) (molecular weight: 15,000, molecular weight distribution (Mw/Mn): 1.1)

Resin (A-7): p-(1-iso-Butoxyethoxy)styrene/p-hydroxystyrene (30/70) (molecular weight: 6,000, molecular weight distribution (Mw/Mn): 1.2)

Resin (A-36): p-(1-Phenethyloxyethoxy)styrene/p-acetoxystyrene/p-hydroxystyrene (30/10/60) (molecular weight: 11,000, molecular weight distribution (Mw/Mn): 1.2)

Resin (A-41) p-[1-(4-tert-Butylcyclohexylcarboxyethoxy)-ethoxy]styrene/p-acetoxystyrene/p-hydroxystyrene (30/10/60) (molecular weight: 12,000, molecular weight distribution (Mw/Mn): 1.1)

Resin (A-43) p-[1-(2-Cyclohexylethoxy)ethoxy]styrene/p-tert-butylstyrene/p-hydroxystyrene (30/8/62) (molecular weight: 18,000, molecular weight distribution (Mw/Mn): 2.3)

Resin (A-22): p-(1-Benzyloxyethoxy)styrene/p-hydroxystyrene (25/75) (molecular weight: 13,000, molecular weight distribution (Mw/Mn): 1.3)

Resin (A-35): p-(1-Benzyloxyethoxy)styrene/p-hydroxystyrene/p-acetoxystyrene (20/70/10) (molecular weight: 9,000, molecular weight distribution (Mw/Mn): 1.2)

Resin (A-14): p-(1-iso-Butoxyethoxy)styrene/p-(tert-butoxycarbonylmethyleneoxy)styrene/p-hydroxystyrene (20/10/70) (molecular weight: 13,000, molecular weight distribution (Mw/Mn): 1.3)

Resin (A-50): Styrene/p-hydroxystyrene/p-(tert-butoxycarbonyloxy)styrene (10/70/20) (molecular weight: 13,000, molecular weight distribution (Mw/Mn): 1.4)

Resin (A-52): p-Hydroxystyrene/p-(1-ethoxyethoxy) styrene/cyclohexyl acrylate (20/70/10) (molecular weight: 18,000, molecular weight distribution (Mw/Mn): 1.9)

Further, the following resins of component (A) were synthesized.

(4)<Synthesis of p-Hydroxystyrene/tert-butyl acrylate (79/21) (Resin (A-48)>

In 150 g of dioxane were dissolved 84.1 g of p-vinylphonol and 22.4 g of tert-butyl acrylate and nitrogen gas was introduced to the solution for one hour. To the solution was added 6.91 g of dimethyl 2,2'-azobisisobutyrate and the mixture was heated to 75° C. under a nitrogen gas stream for 12 hours to conduct polymerization. After the completion of the polymerization, the reaction mixture was cooled to a room temperature. Then, 150 g of acetone was added to the mixture to dilute and the mixture was dropwise added to a large amount of hexane to obtain a solid polymer. The dilution with acetone and dropwise addition to hexane were repeated three times, thereby removing the residual monomers. The resulting polymer was dried at 60° C. under a reduced pressure to obtain Resin (A-48). As a result of the analysis by NMR, the ratio of p-vinylphenol/tert-butyl acrylate was 79/21. The Mw of the resin was 12,000 and the molecular weight distribution (Mw/Mn) thereof was 2.6.

(5)<Synthesis of p-(1-iso-Butoxyethoxy)styrene/p-hydroxystyrene/tert-butyl acrylate (20/59/21) (Resin (A-16)>

In 80 g of propylene glycol monomethyl ether acetate (PGMEA) was dissolved 20 g of Resin (A-48) described above and the solution was heated to 60° C., then gradually reduced the pressure to 20 mmHg to remove the PGMEA and water in the system by azeotropic distillation. Thereafter, the solution was cooled to 20° C. and 2.2 g of isobutyl vinyl ether and then 3 mg of p-toluenesulfonic acid were added thereto, followed by reacting for 2 hours. A small amount of triethylamine was added to the solution to neutralize the acid. Then, ethyl acetate was poured into the reaction solution and the mixture was washed with ion-exchanged water to remove the salt. The ethyl acetate and water were distilled off under a reduced pressure from the mixture to obtain Resin (A-16).

(6) p-Hydroxystyrene/styrene/tert-butyl acrylate (78/7/15) (molecular weight: 13,100, molecular weight distribution (Mw/Mn): 2.7) (Resin (A-51) was synthesized in the same manner as Synthesis of Resin (A-48) described above.

(7)<Synthesis of p-Hydroxystyrene/p-(tert-butoxycarbonyloxy)styrene (60/40) (Resin (A-49))>

In 40 ml of pyridine was dissolved poly(p-hydroxystyrene) (VP-8000, manufactured by Nippon Soda Co., Ltd., weight average molecular weight: 1,1000) and to the solution was added 1.28 g of di-tert-butyl dicarbonate at a room temperature with stirring. The solution was reacted at a room temperature for 3 hours and poured into a solution of one liter of ion exchange water and 20 g of concentrated hydrochloric acid. The powder thus-deposited was collected by filtration, washed with water and dried to obtain 2.1 g of p-hydroxystyrene/p-(tert-butoxycarbonyloxy)-styrene (60/40) copolymer.

Examples 1 to 42 and Comparative Examples 1 to 3

Each of the components described in Table 1 shown below was dissolved in each of the solvents described in Table 1 shown below in such a proportion as to result in a solid content of 15% by weight and filtered through a polyethylene filter of 0.1 μm to prepare positive photoresist solutions for Examples 1 to 42 and Comparative Examples 1 to 3, respectively. The positive photoresist solutions were evaluated in the following manner:

A: Evaluation on exposure with KrF excimer laser

The positive photoresist solution was uniformly coated on a silicon wafer subjected to treatment with hexamethyldisilazane using a spin coater and dried by heating at 120° C. for 90 seconds on a hot plate to prepare a resist film having a thickness of 0.6 μm. The resist film was subjected to pattern exposure with a KrF exp eximer laser stepper (NA=0.63) using a mask pattern composed of lines and spaces. After the pattern exposure, the resist film was immediately heated at 110° C. for 90 seconds on a hot plate. Then, the resist film was developed with a 2.38% by weight aqueous tetramethyl ammonium hydroxide solution at 23° C. for 60 seconds, rinsed with pure water for 30 seconds and dried. The resist pattern formed on the silicon wafer was evaluated its resist performance in the manner described below.

Resolution

The resolution represents a threshold resolution at the exposure amount at which a mask pattern composed of lines and spaces (1/1) each having a width of 0.18 μm is reproduced.

Exposure Margin

The exposure amount at which a mask pattern composed of lines and spaces (1/1) each having a width of 0.16 μm is reproduced is designated the optimum exposure amount, and a value obtained by dividing an exposure amount range for reproducing a line width of 0.16 μm ±10% by the optimum exposure amount is represented by percentage (%). The larger the value, the smaller change in line width depending to the change in the exposure amount.

Depth of Focus

The depth of focus was measured with a mask pattern composed of lines and spaces (1/1) each having a width of 0.15 μm at the exposure amount at which a mask pattern composed of lines and spaces (1/1) each having a width of 0.15 μm is reproduced. The larger the value, the broader the depth of focus.

The results obtained are shown in Table 2 below.

TABLE 1

| Example | Component (A) | Component (B) | Component (C) | Component (D) | Component (B') | Component (F) | Component (G) | Solvent |
|---|---|---|---|---|---|---|---|---|
| 1 | (A-3) 10 g | (II-1) 0.5 g | nil | Nil | nil | (1) 0.025 g | (W1) 0.03 g | PGMEA |
| 2 | (A-7) 10 g | (II-3) 0.5 g | nil | Nil | nil | (2) 0.025 g | (W2) 0.03 g | PGMEA |
| 3 | (A-14) 10 g | (II-4) 0.5 g | nil | Nil | nil | (3) 0.025 g | (W3) 0.03 g | PGMEA |
| 4 | (A-16) 10 g | (II-14) 0.5 g | nil | Nil | nil | (4) 0.025 | (W4) 0.03 g | PGMEA |
| 5 | (A-25) 10 g | (II-16) 0.5 g | nil | Nil | nil | (1) 0.03 g | (W1) 0.03 g | PGMEA |
| 6 | (A-36) 10 g | (II-36) 0.5 g | nil | Nil | nil | (2) 0.05 g | (W4) 0.03 g | PGMEA |
| 7 | (A-38) 10 g | (II-43) 0.5 g | nil | Nil | nil | (2) 0.02 g | (W2) 0.03 g | PGMEA |
| 8 | (A-41) 10 g | (II-24)/ (III-3)* 0.5 g | nil | Nil | nil | (2) 0.025 g | (W4) 0.05 g | PGMEA/PGMEA = 8/2 |
| 9 | (A-43) 10 g | (IV-2) 0.5 g | nil | Nil | nil | (1) 0.025 g | (W1) 0.03 g | EL/EEP = 8/2 |
| 10 | (A-48) 10 g | (V-1) 0.5 g | nil | Nil | nil | (1) 0.025 g | (W4) 0.03 g | EL/EEP = 8/2 |
| 11 | (A-49) 10 g | (I-3) 0.5 g | nil | Nil | Nil | (4) 0.015 g | (W2) 0.03 g | EL/EEP = 8/2 |
| 12 | (A-51) 10 g | (I-14) 0.5 g | nil | Nil | Nil | (3) 0.01 g | (W4) 0.05 g | EL/EEP = 8/2 |
| 13 | (A-3) 10 g | (II-1) 0.2 g | (C-2) 0.3 g | Nil | Nil | (2) 0.02 g | (W4) 0.05 g | PGMEA/PGME = 8/2 |
| 14 | (A-7) 10 g | (II-3) 0.6 g | (C-3) 0.1 g | Nil | Nil | (2) 0.025 g | (W4) 0.05 g | EL/EEP = 8/2 |
| 15 | (A-22) 10 g | (II-4) 0.2 g | (C-4) 0.5 g | Nil | Nil | (1) 0.025 g | (W2) 0.03 g | EL/EEP = 8/2 |
| 16 | (A-25) 10 g | (II-14) 0.1 g | (C-5) 0.3 g | nil | Nil | (1) 0.025 g | (W2) 0.03 g | CH |
| 17 | (A-36) 10 g | (II-16) 0.2 g | (C-1) 0.4 g | nil | (B'-1) 0.1 g | (4) 0.005 g | (W4) 0.05 g | PGMEA/PGME = 8/2 |
| 18 | (A-38) 10 g | (II-36) 0.5 g | (C-2) 0.2 g | nil | (B'-2) 0.2 g | (3) 0.005 g | (W1) 0.03 g | PGMEA/PGME = 8/2 |
| 19 | (A-41) 10 g | (II-43) 0.4 g | nil | nil | (B'-3) 0.2 g | Nil | (W2) 0.03g | PGMEA/PGME = 8/2 |

TABLE 1-continued

| | Component (A) | Component (B) | Component (C) | Component (D) | Component (B') | Component (F) | Component (G) | Solvent |
|---|---|---|---|---|---|---|---|---|
| 20 | (A-43) 10 g | (I-4) 0.5 g | nil | nil | (B'-4) 0.4 g | Nil | (W3) 0.03 g | PGMEA/PGME = 8/2 |
| 21 | (A-35) 10 g | (I-14) 0.2 g | nil | nil | (B'-2) 0.2 g | Nil | (W4) 0.03 g | PGMEA/PGME = 8/2 |
| 22 | (A-48) 9 g | (II-1) 0.2 g | (C-1) 0.1 g (C-2) 0.3 g | (D-1) 1 g | Nil | (1) 0.025 g (2) 0.025 g | (W1) 0.03 g | PGMEA/PGME = 8/2 |
| 23 | (A-49) 10 g | (II-16) 0.4 g | (C-3) 0.2 g (C-4) 0.4 g | nil | Nil | (2) 0.1 g | (W4) 0.03 g | PGMEA/BL = 8/2 |
| 24 | (A-51) 9 g | (II-5) 0.7 g | (C-3) 0.2 g | (D-1) 1 g | (B'-4) 0.03 g | (1) 0.06 g | (W2) 0.03 g | PGMEA/BL = 8/2 |
| 25 | (A-25) 10 g | (II-4) 0.25 g (II-16) 0.25 g | nil | nil | Nil | (1) 0.025 g | (W4) 0.05 g | PGMEA/BL = 8/2 |
| 26 | (A-36) 10 g | (II-27) 0.5 g | nil | nil | Nil | (1) 0.025 g | (W1) 0.03 g | PGMEA |
| 27 | (A-38) 10 g | (II-18) 0.7 g | nil | nil | Nil | (4) 0.015 g | (W4) 0.03 g | PGMEA |
| 28 | (A-41) 10 g | (II-46) 0.3 g | nil | nil | Nil | (3) 0.01 g | (W2) 0.03 g | PGMEA |
| 29 | (A-43) 10 g | (II-22) 0.4 g | nil | nil | Nil | (2) 0.02 g | (W4) 0.05 g | PGMEA |
| 30 | (A-25) 10 g | (II-32) 0.25 g (I-6) 0.25 | nil | nil | Nil | (1) 0.025 g | (W4) 0.05 g | PGMEA |
| 31 | PHS/ST 10 g | (II-1) 0.4 g | (C-3) 0.2 g | (D-1) 1 g | Nil | (1) 0.025 g | (W4) 0.05 g | PGMEA |
| 32 | (A-3) 5 g (A-38) 5 g | (II-49) 0.05 g | (PAG4-12) 0.1 g (PAG7-2) 0.3 g | nil | (B'-2) 0.1 g | nil | (W1) 0.03 g | PGMEA/PGME = 8/2 |
| 33 | (A-52) 2 g (A-38) 8 g | (II-49) 0.2 g | (PAG4-12) 0.1 g (PAG7-2) 0.3 g | nil | (B'-2) 0.1 g | (2) 0.025 g | (W2) 0.03 g | PGMEA/PGME = 8/2 |
| 34 | (A-14) 10 g | (II-59) 0.1 g | (PAG4-15) 0.3 g | nil | Nil | (3) 0.025 | (W3) 0.03 g | PGMEA |
| 35 | (A-51) 5 g (A-3) 5 g | (II-61) 0.2 g | (PAG4-10) 0.1 g (PAG7-2) 0.3 g | nil | Nil | (4) 0.025 g | (W4) 0.03 g | PGMEA |
| 36 | (A-25) 10 g | (II-64) 0.05 g | (PAG4-4) 0.3 g | nil | Nil | (1) 0.03 g | (W1) 0.03 g | PGMEA |
| 37 | (A-36) 10 g | (II-50) 0.5 g | (PAG4-6) 0.2 g | nil | (B'-2) 0.1 g | nil | (W4) 0.03 g | PGMEA |
| 38 | (A-38) 10 g | (II-56) 0.5 g | (PAG4-14) 0.4 g | nil | Nil | (2) 0.02 g | (W2) 0.03 g | PGMEA |
| 39 | (A-50) 7 g (A-38) 3 g | (I-25) g | (PAG4-13) 0.1 g (PAG7-2) 0.3 g | nil | Nil | (2) 0.025 g | (W4) 0.05 g | PGMEA/PGME = 8/2 |
| 40 | (A-43) 10 g | (I-31) 0.3 g | (PAG4-9) 0.1 g (PAG7-2) 0.3 g | nil | Nil | (1) 0.025 g | (W1) 0.03 g | EL/EEP = 8/2 |
| 41 | (A-48) 10 g | (I-33) 0.2 g | (PAG4-15) 0.2 g (PAG7-2) 0.3 g | Nil | (B'-2) 0.1 g | (1) 0.025 g | (W4) 0.03 g | EL/EEP = 8/2 |
| 42 | (A-52) 2 g (A-38) 8 g | (II-67) 0.2 g | (PAG4-12) 0.1 g (PAG7-2) 0.3 g | Nil | (B'-2) 0.1 g | (2) 0.025 g | (W2) 0.03 g | PGMEA/PGME = 8/2 |
| Comparative Example | | | | | | | | |
| 1 | (A-3) 10 g | nil | (C-3) 0.5 g | Nil | Nil | (1) 0.025 g | (W1) 0.03 g | PGMEA |
| 2 | (A-36) 10 g | nil | (C-1) 0.4 g | Nil | (B'-1) 0.1 g | (4) 0.005 g | (W4) 0.05 g | PGMEA/PGME = 8/2 |
| 3 | (A-48) | nil | (C-1) | (D-1) | Nil | (1) | (W4) | PGMEA/PGME = |

TABLE 1-continued

| Component (A) | Component (B) | Component (C) | Component (D) | Component (B') | Component (F) | Component (G) | Solvent |
|---|---|---|---|---|---|---|---|
| 9 g | | 0.1 g (C-2) 0.3 g | 1 g | | 0.025 g (2) 0.025 g | 0.05 g | 8/2 |

Remarks for the components shown in Table 1:
Component (A) (the amount is indicated as a solid content): PHS/ST used in Example 31 is p-hydroxystyrene/styrene (molar ratio: 85/15) copolymer (weight average molecular weight: 20,000, molecular weight distribution: 2.9) which is an alkali-soluble resin.
Component (B): In Example 8, a mixture of Compound (II-24) and Compound (III-3) as the main component synthesized in Synthesis Example 1(5) was used.
Component (C):
(C-1): (PAG4-5)
(C-2): (PAG4-4)
(C-3): (PAG4-1)
(C-4): (PAG7-2)
(C-5): Photo-acid generator generating a sulfonic acid, which has the following formula:

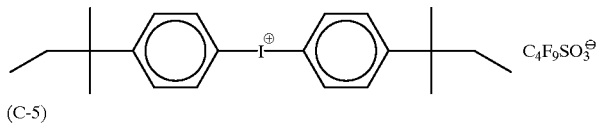

(C-5)

Component (D):
(D-1): Compound having the following formula:

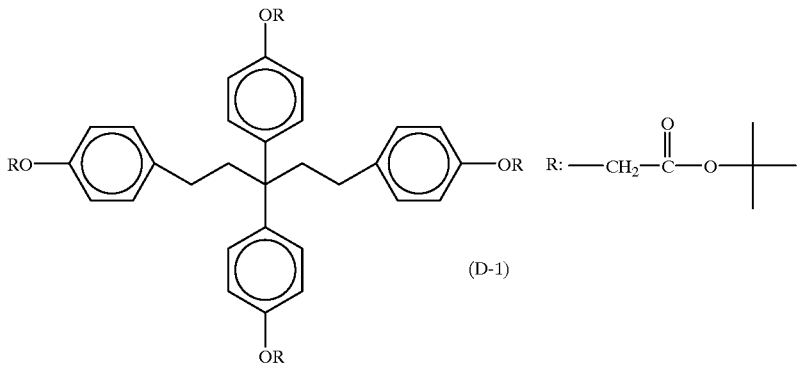

(D-1)

Component (F) (Basic Compound Component):
(1): 1,5-Diazabicyclo[4,3,0]-5-nonene
(2): 2,4,5-Triphenylimidazole
(3): Tri-n-butylamine
(4): N-Hydroxyethylpiperidine
Component (G) (Suface Active Agent Component):
(W-1): Megafac F176 (manufactured by Dainippon Ink and Chemicals, Inc.) (fluorine-base)
(W-2): Megafac R08 (manufactured by Dainippon Ink and Chemicals, Inc.) (fluorine- and silicon-base)
(W-3): Polysiloxane Polymer KP-341 (manufactured by Shin-Etsu Chemical Co., Ltd.)
(W-4): TROYSOL S-366 (manufactured by TROY CHEMICAL Co., LTD.) (silicon-base)
Solvent:
PGMEA: Polypropylene glycol monomethyl ether acetate
PGME: Polypropylene glycol monomethyl ether (1-methoxy-2-propanol)
EL: Ethyl lactate
EEP: Ethyl ethoxypropionate
BL: γ-Butyrolactone
CH: Cyclohexanone

TABLE 2

| | Resolution (μm) | Exposure Margin (%) | Depth of Focus (μm) |
|---|---|---|---|
| Example | | | |
| 1 | 0.13 | 10.0 | 1.3 |
| 2 | 0.13 | 9.5 | 1.2 |
| 3 | 0.13 | 10.0 | 1.2 |
| 4 | 0.13 | 10.0 | 1.2 |
| 5 | 0.125 | 12.0 | 1.5 |
| 6 | 0.125 | 11.5 | 1.4 |
| 7 | 0.125 | 12.0 | 1.5 |
| 8 | 0.125 | 12.5 | 1.5 |
| 9 | 0.14 | 8.5 | 1.0 |
| 10 | 0.14 | 7.8 | 1.0 |
| 11 | 0.14 | 8.0 | 1.1 |
| 12 | 0.14 | 7.0 | 1.0 |
| 13 | 0.13 | 10.2 | 1.2 |
| 14 | 0.13 | 10.1 | 1.2 |
| 15 | 0.125 | 11.5 | 1.4 |
| 16 | 0.125 | 12.0 | 1.5 |
| 17 | 0.125 | 12.5 | 1.4 |
| 18 | 0.125 | 11.5 | 1.5 |
| 19 | 0.125 | 12.5 | 1.5 |
| 20 | 0.13 | 9.8 | 1.2 |
| 21 | 0.13 | 9.9 | 1.2 |
| 22 | 0.14 | 8.0 | 1.0 |
| 23 | 0.14 | 7.8 | 1.1 |
| 24 | 0.14 | 8.1 | 1.0 |
| 25 | 0.125 | 12.0 | 1.4 |
| 26 | 0.125 | 12.5 | 1.5 |
| 27 | 0.125 | 11.5 | 1.5 |
| 28 | 0.125 | 12.0 | 1.4 |
| 29 | 0.125 | 11.5 | 1.5 |
| 30 | 0.125 | 12.0 | 1.5 |
| 31 | 0.14 | 8.0 | 0.9 |
| 32 | 0.125 | 9.0 | 1.4 |
| 33 | 0.130 | 10.8 | 1.2 |
| 34 | 0.125 | 11.4 | 1.5 |
| 35 | 0.130 | 12.0 | 1.0 |
| 36 | 0.130 | 11.7 | 1.3 |
| 37 | 0.125 | 9.6 | 1.4 |
| 38 | 0.125 | 10.2 | 1.5 |
| 39 | 0.125 | 11.6 | 1.5 |
| 40 | 0.130 | 10.9 | 1.2 |
| 41 | 0.130 | 9.8 | 1.1 |
| 42 | 0.130 | 10.8 | 1.2 |
| Comparative Example | | | |
| 1 | 0.14 | 4.2 | 0.6 |
| 2 | 0.14 | 3.4 | 0.4 |
| 3 | 0.14 | 4.1 | 0.4 |

From the results shown in Table 2 above, it can be seen that the resist films of Examples 1 to 42 according to the positive photoresist composition of the present invention form patterns with high resolution, broad exposure margin and broad depth of focus by exposure a KrF excimer laser beam which is a far ultraviolet ray. On the contrary, in case of Comparative Examples 1 to 3 in which Component (B) is not used, the exposure margin and depth of focus are narrow.

B: Evaluation on exposure with electron beam

Of the components described in Table 1 above, those corresponding to the examples as shown in Table 3 below were dissolved in the solvents in such a proportion as to result in a solid content of 17% by weight to prepare positive photoresist solutions, respectively. The positive photoresist solution was uniformly coated on a silicon substrate subjected to treatment with hexamethyldisilazane using a spin coater and dried by heating at 120° C. for 60 seconds on a hot plate to prepare a resist film having a thickness of 0.8 μm. The resist film was subjected to exposure using an electron beam recording device (acceleration voltage: 50 keV, beam diameter: 0.20 μm). After the exposure, the resist film was immediately heated at 110° C. for 90 seconds on a hot plate. Then, the resist film was developed with a 2.38% by weight aqueous tetramethyl ammonium hydroxide solution at 23° C. for 60 seconds, rinsed with pure water for 30 seconds and dried. The resist pattern formed on the silicon wafer was evaluated its resist performance in the manner described below.

Profile

The pattern of contact hole of 0.2 μm formed was observed by a scanning electron microscope to evaluate the profile.

Sensitivity

The sensitivity was evaluated by measuring an exposure amount ($\mu C/cm^2$) necessary for reproducing a pattern of contact hole of 0.20 μm.

Resolution

The resolution represents a threshold resolution at the exposure amount necessary for reproducing a pattern of contact hole of 0.20 μm.

The results obtained are shown in Table 3 below.

TABLE 3

| Example (EB) | Sensitivity ($\mu C/cm^2$) | Resolution (μm) | Profile |
|---|---|---|---|
| 3 | 6 | 0.08 | rectangle |
| 4 | 4 | 0.09 | rectangle |
| 14 | 6 | 0.10 | rectangle |
| 20 | 5 | 0.10 | rectangle |
| 21 | 6 | 0.09 | rectangle |
| 24 | 7 | 0.09 | rectangle |
| 25 | 9 | 0.10 | rectangle |
| 31 | 7 | 0.10 | rectangle |
| 32 | 2 | 0.10 | rectangle |
| 33 | 6 | 0.09 | rectangle |
| 34 | 4 | 0.10 | rectangle |
| 35 | 7 | 0.10 | rectangle |
| 36 | 3 | 0.09 | rectangle |
| 37 | 4 | 0.09 | rectangle |
| 38 | 5 | 0.10 | rectangle |
| 39 | 6 | 0.10 | rectangle |
| 40 | 7 | 0.09 | rectangle |
| 41 | 6 | 0.09 | rectangle |
| 42 | 6 | 0.09 | rectangle |

From the results shown in Table 3 above, it can be seen that by the exposure with an electron beam, the positive photoresist composition of the present invention form patterns with high sensitivity, high resolution and excellent rectangular profile without forming reverse taper profile due to the scattering specifically caused by the electron beam exposure.

While the invention has been described in detail and with reference to specific examples thereof, it will be apparent to one skilled in the art that various changes and modifications can be made therein without departing from the spirit and scope thereof.

What is claimed is:

1. A positive photoresist composition which comprises (A) a resin having a group which decomposes by the action of an acid to increase solubility in an alkaline developing solution, and (B) a compound which generates an aliphatic or aromatic carboxylic acid substituted with at least one fluorine atom upon irradiation with an actinic ray or radiation,
   wherein said aliphatic carboxylic acid susbstituted with at least one fluorine atom contains 4 to 20 carbon atoms and said aromatic carboxylic acid substituted with at least one fluorine atom contains 7 to 20 carbon atoms.

2. The positive photoresist composition as claimed in claim 1, wherein the composition further comprises (D) a compound having a molecular weight of not more than 3,000 which decomposes by the action of an acid to increase solubility in an alkaline developing solution.

3. A positive photoresist composition which comprises (B) a compound which generates an aliphatic or aromatic carboxylic acid substituted with at least one fluorine atom upon irradiation with an actinic ray or radiation, wherein said aliphatic carboxylic acid substituted with at least one fluorine atom contains 4 to 20 carbons atoms and said aromatic carboxylic acid substituted with at least one fluorine atom contains 7 to 20 atoms (D) a compound having a molecular weight of not more than 3,000 which decomposes by the action of an acid to increase solubility in an alkaline developing solution, and (E) an alkali-soluble resin.

4. The positive photoresist composition as claimed in claim 1, wherein the composition further comprises (C) a compound which generates a sulfonic acid upon irradiation with an actinic ray or radiation.

5. The positive photoresist composition as claimed in claim 1, wherein the composition further comprises (F) a nitrogen-containing basic compound and (G) a fluorine-base or silicon-base surface active agent.

6. The positive photoresist composition as claimed in claim 1, wherein (B) the compound which generates an aliphatic or aromatic carboxylic acid substituted with at least one fluorine atom upon irradiation with an actinic ray or radiation is a compound represented by the following formula (I), (II) or (III):

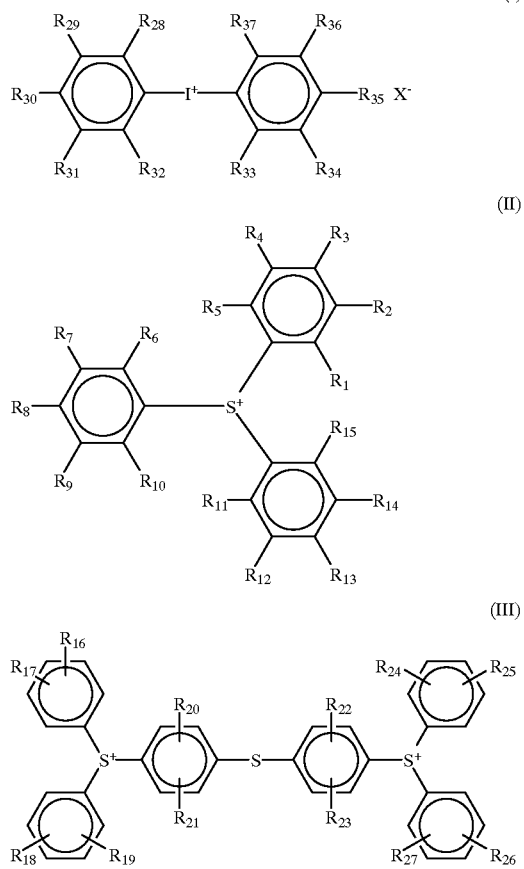

wherein $R_1$ to $R_{37}$, which may be the same or different, each represents a hydrogen atom, a straight chain, branched chain or cyclic alkyl group, a straight chain, branched chain or cyclic alkoxy group, a hydroxy group, a halogen atom or an —S—$R_{38}$ group (wherein $R_{38}$ represents a straight chain, branched chain or cyclic alkyl group or an aryl group); and $X^-$ represents an anion of an aliphatic or aromatic carboxylic acid substituted with at least one fluorine atom.

7. The positive photoresist composition as claimed in claim 6, wherein $X^-$ represents an anion of a perfluoro aliphatic carboxylic acid or a perfluoro aromatic carboxylic acid.

8. The positive photoresist composition as claimed in claim 6, wherein $X^-$ represents an anion of a perfluoro alkyl carboxylic acid having not less than 4 carbon atoms.

9. The positive photoresist composition as caimed in claim 1, wherein (A) the resin having a group which decomposes by the action of an acid to increase solubility in an alkaline developing solution is a resin containing a repeating unit represented by formula (IV) shown below and a repeating unit represented by formula (V) shown below.

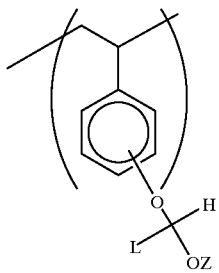

(IV)

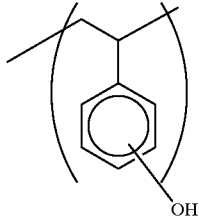

(V)

wherein L represents a hydrogen atom, a straight-chain, branched chain or cyclic alkyl group which may be substituted or an aralkyl group which may be substituted; Z represents a straight-chain, branched chain or cyclic alkyl group which may be substituted or an aralkyl group which may be substituted; or Z and L may be combined with each other to form a 5-membered or 6-membered ring.

10. The positive photoresist composition as claimed in claim 9, wherein Z in formula (IV) represents a substituted alkyl group or a substituted aralkyl group.

11. The positive photoresist composition as claimed in claim 1, wherein the composition further comprises (B') a compound which generates a carboxylic acid which is not substituted with a fluorine atom upon irradiation with an actinic ray or radiation.

12. The positive photoresist composition as claimed in claim 1, wherein the aliphatic carboxylic acid substituted with a fluorine atom which is generated from the compound of component (B) is that represented by the following formula (VI):

$$L—(CH_2)_p(CF_2)_q(CH_2)_r—COOH \quad (VI)$$

wherein L represents a hydrogen atom or a fluorine atom; p and r, which may be the same or different, each represents an integer of from 0 to 15; and q represents an integer of from 1 to 15.

13. The positive photoresist composition as claimed in claim 1, wherein the composition further comprises a compound which generates an acid upon irradiation with an actinic ray or radiation other than the compound of component (B).

14. The positive photoresist composition as claimed in claim 13, wherein the compound which generates an acid upon irradiation with an actinic ray or radiation other than the compound of component (B) is that selected from diazonium salts, ammonium salts, phosphonium salts, iodonium salts, sulfonium salts, selenonium salts, arsonium salts, organic halide compounds, organic metal/organic halide compounds, photo-acid generators having an o-nitrobenzyl type protective group, compounds which photolyze to generate a sulfonic acid, disulfone compounds, diazoketosulfone compounds and diazodisulfone compounds.

15. The positive photoresist composition as claimed in claim 14, wherein the compound which generates an acid upon irradiation with an actinic ray or radiation other than the compound of component (B) is that represented by the following formula (PAG3), (PAG4), (PAG6) or (PAG7):

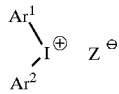
(PAG3)

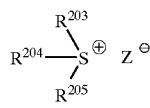
(PAG4)

wherein $Ar^1$ and $Ar^2$, which may be the same or different, each represents a substituted or unsubstituted aryl group; $R^{203}$, $R^{204}$ and $R^{205}$, which may be the same or different, each represents a substituted or unsubstituted alkyl group or a substituted or unsubstituted aryl group, or two of $R^{203}$, $R^{204}$ and $R^{205}$ or $Ar^1$ and $Ar^2$ may be combined through a single bond or a substituent; and $Z^-$ represents a counter anion,

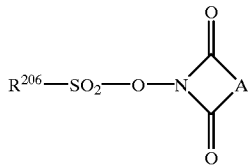
(PAG6)

wherein $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group,

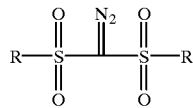
(PAG7)

wherein R represents a straight-chain, branched chain or cyclic alkyl group or an aryl group which may be substituted.

16. The positive photoresist composition as claimed in claim 1, wherein the resin of component (B) has an acid-decomposable group in the polymer main chain or side chain, or both the polymer main chain and side chain.

17. The positive photoresist composition as claimed in claim 16, wherein the acid-decomposable group is a group represented by formula —COOA⁰ or —O—B⁰ wherein A⁰ represents —C($R^{01}$)($R^{02}$)($R^{03}$), —Si($R^{01}$)($R^{02}$) ($R^{03}$) or —C($R^{04}$)($R^{05}$)—O—($R^{06}$); B⁰ represents —A⁰ or —COO—A⁰; $R^{01}$, $R^{02}$, $R^{03}$, $R^{04}$ and $R^{05}$, which may be the same or different, each represents a hydrogen atom, an alkyl group, a cycloalkyl group, an alkenyl group or an aryl group; and $R^{06}$ represents an alkyl group or an aryl group, provided that at least two of $R^{01}$ to $R^{03}$ are not hydrogen atoms; or two of $R^{01}$ to $R^{03}$ are bonded to each other to form a ring or two of $R^{04}$ to $R^{06}$ are bonded to each other to form a ring.

18. The positive photoresist composition as claimed in claim 1, wherein the resin of component (B) is that whose 1 μm-thick film has transmittance at 248 nm of from 20% to 90%.

19. The positive photoresist composition as claimed in claim 3, wherein the compound of component (D) is that containing at least two acid-decomposable groups in its structure wherein at least 8 connecting atoms other than acid-decomposable group are interposed between the acid-decomposable groups which are separated from each other at the greatest distance.

20. The positive photoresist composition as claimed in claim 1, wherein the composition further comprises a nitrogen-containing basic compound.

21. The positive photoresist composition as claimed in claim 20, wherein the nitrogen-containing basic compound is that represented by the following formula (A), (B), (C), (D) or (E):

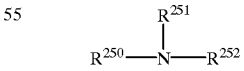
(A)

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbons atoms, or $R^{251}$ and $R^{252}$ may be combined with each other to form a ring;

(B) 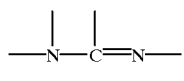
(C) 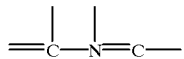
(D) 
-continued
(E) 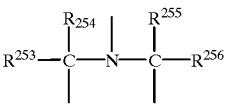
wherein $R^{253}$, $R^{254}$, $R^{255}$ and $R^{256}$, which may be the same or different, each represents an alkyl group having from 1 to 6 carbon atoms.
* * * * *